United States Patent
Finley

(10) Patent No.: US 9,651,957 B1
(45) Date of Patent: May 16, 2017

(54) ADJUSTABLE NON-DISSIPATIVE VOLTAGE BOOSTING SNUBBER NETWORK

(71) Applicant: Advanced Energy Industries, Inc., Fort Collins, CO (US)

(72) Inventor: Kenneth W. Finley, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 15/256,070

(22) Filed: Sep. 2, 2016

Related U.S. Application Data

(63) Continuation of application No. 14/945,324, filed on Nov. 18, 2015, now Pat. No. 9,483,066.

(51) Int. Cl.
- *G05F 1/46* (2006.01)
- *H05H 1/46* (2006.01)
- *H02H 3/087* (2006.01)
- *H01J 37/34* (2006.01)
- *H05H 1/48* (2006.01)

(52) U.S. Cl.
CPC ............ *G05F 1/46* (2013.01); *H01J 37/3405* (2013.01); *H01J 37/3444* (2013.01); *H02H 3/087* (2013.01); *H05H 1/46* (2013.01); *H05H 1/48* (2013.01); *H05H 2001/4682* (2013.01)

(58) Field of Classification Search
CPC .............. H05H 1/46; H05H 2001/4682; H01J 37/3444; H01J 37/34; H01J 37/3467; H01J 37/32027; H01J 37/32045; H01J 37/32174; H01J 37/32623; H01J 37/3405; H01J 37/3408; H01J 37/3417; H01J 37/3429
See application file for complete search history.

(56) References Cited

U.S. PATENT DOCUMENTS

| | | |
|---|---|---|
| 2005/0092596 A1 | 5/2005 | Kouznetsov |
| 2006/0192774 A1 | 8/2006 | Yasumura |
| 2007/0217093 A1 | 9/2007 | Xue et al. |
| 2008/0203070 A1 | 8/2008 | Ilic et al. |
| 2011/0011737 A1 | 1/2011 | Wu et al. |
| 2011/0075445 A1 | 3/2011 | Drummond et al. |
| 2011/0120861 A1 | 5/2011 | Horishita et al. |
| 2011/0248633 A1 | 10/2011 | Nauman et al. |
| 2012/0025726 A1 | 2/2012 | Watanabe et al. |
| 2014/0159648 A1 | 6/2014 | Sadwick |

FOREIGN PATENT DOCUMENTS

| | | |
|---|---|---|
| CN | 101641604 A | 2/2010 |
| EP | 2316123 A1 | 5/2011 |

OTHER PUBLICATIONS

SIPO, "Chinese Office Action Re Application No. 201380068716.9", Oct. 24, 2016, p. 19, Published in: CN.

(Continued)

Primary Examiner — Monica C King
(74) Attorney, Agent, or Firm — Neugeboren O'Dowd PC

(57) ABSTRACT

This disclosure describes a non-dissipative snubber circuit configured to boost a voltage applied to a load after the load's impedance rises rapidly. The voltage boost can thereby cause more rapid current ramping after a decrease in power delivery to the load which results from the load impedance rise. In particular, the snubber can comprise a combination of a unidirectional switch, a voltage multiplier, and a current limiter. In some cases, these components can be a diode, voltage doubler, and an inductor, respectively.

22 Claims, 27 Drawing Sheets

(56) References Cited

OTHER PUBLICATIONS

King, Monica C., "Office Action Re U.S. Appl. No. 14/185,213", Jul. 23, 2015, p. 5 Published in: US.
Gruber, Stephen S., "Response to Office Action Re U.S. Appl. No. 14/185,213", Sep. 13, 2015, pp. 10, Published in: US.
King, Monica C., "Restriction Requirement re U.S. Appl. No. 14/184,968", Jul. 23, 2015, p. 5 Published in: US.
Gruber, Stephen S., "Response to Restriction Requirement re U.S. Appl. No. 14/184,968", Sep. 23, 2015, pp. 7, Published in: US.
King, Monica C., "Office Action re U.S. Appl. No. 15/055,761", Sep. 2, 2016, pp. 7 Published in: US.
Gruber, Stephen S., "Response to Office Action Re U.S. Appl. No. 15/055,761", Nov. 7, 2016, pp. 9, Published in: US.
King, Monica C., "Office Action re U.S. Appl. No. 14/945,324", Jun. 10, 2016, pp. 24 Published in: US.
Gruber, Stephen S., "Response to Office Action re U.S. Appl. No. 14/945,324", Jul. 8, 2016, pp. 9 Published in: US.
King, Monica C., "Office Action Re U.S. Appl. No. 13/666,668", Jan. 30, 2015, pp. 6 Published in: US.
O'Dowd, Sean R., "Response to Office Action Re U.S. Appl. No. 13/666,668", Mar. 27, 2015, pp. 8, Published in: US.
Belkind, A. et al., "Characterization of Pulsed DC Magnetron Sputtering Plasmas", Apr. 6, 2005, pp. 19 vol. 7, No. 1, Publisher: New Journal of Physics.
Christie, et al., "High performance pulsed current source supplies for large area", Nov. 2, 2000, pp. 12, Published in: US.
O'Dowd, Sean R., "Response to Office Action re U.S. Appl. No. 13/666,688", Mar. 27, 2015, pp. 8 Published in: US.
Koh, Eugene, "International Search Report and Written Opninion re Application No. PCT/US2013/068033", Feb. 3, 2014, pp. 17 Published in: AU.
Sittinger, et al., "Position and Time Resolved Optical Emission Spectroscopy and Film Properties of", 2007, pp. 6, Published in: US.
Todd, Philip C., "Snubber Circuits: Theory, Design and Application", "Unitrode Corporation", May 1993, pp. 2-1 through 2-17, Publisher: Texas Instruments, Published in: US.
Wittmann-Regis, Agnes, "International Preliminary Report on Patentability re Application No. PCT/US2013/068033", May 14, 2015, pp. 12 Published in: US.

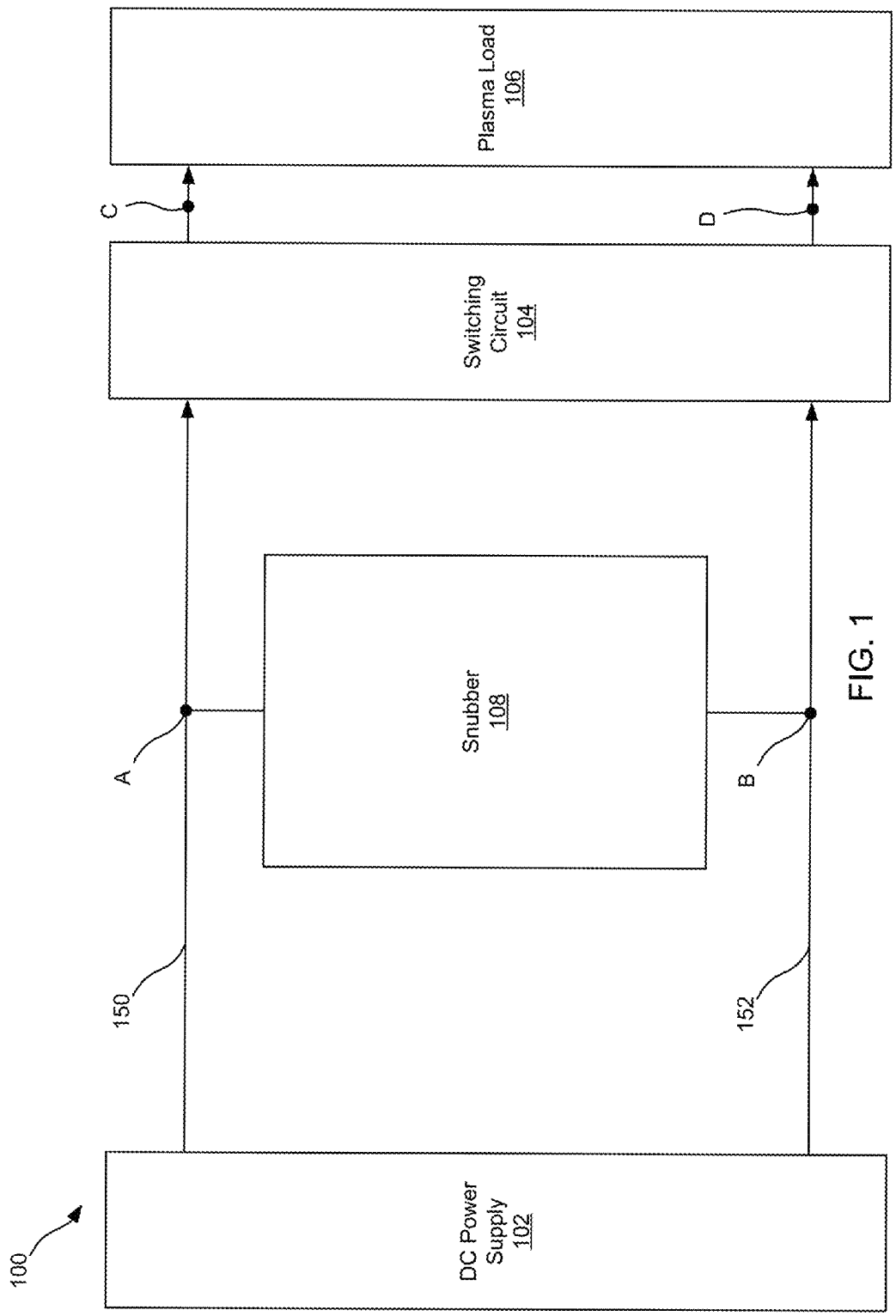

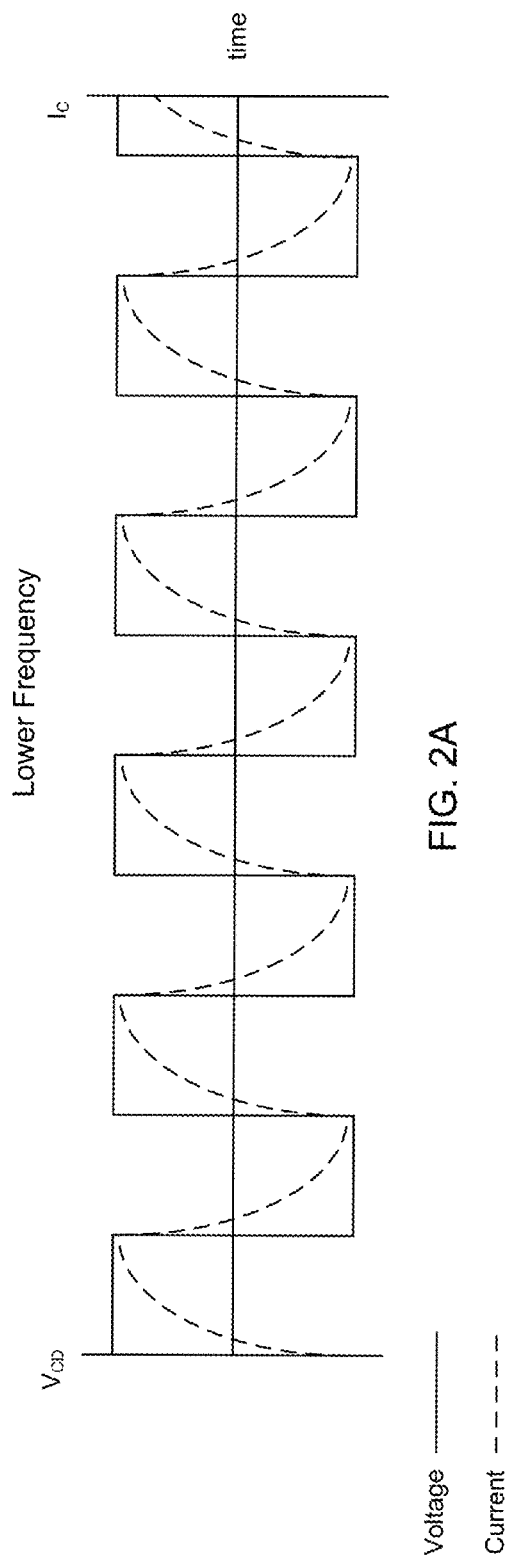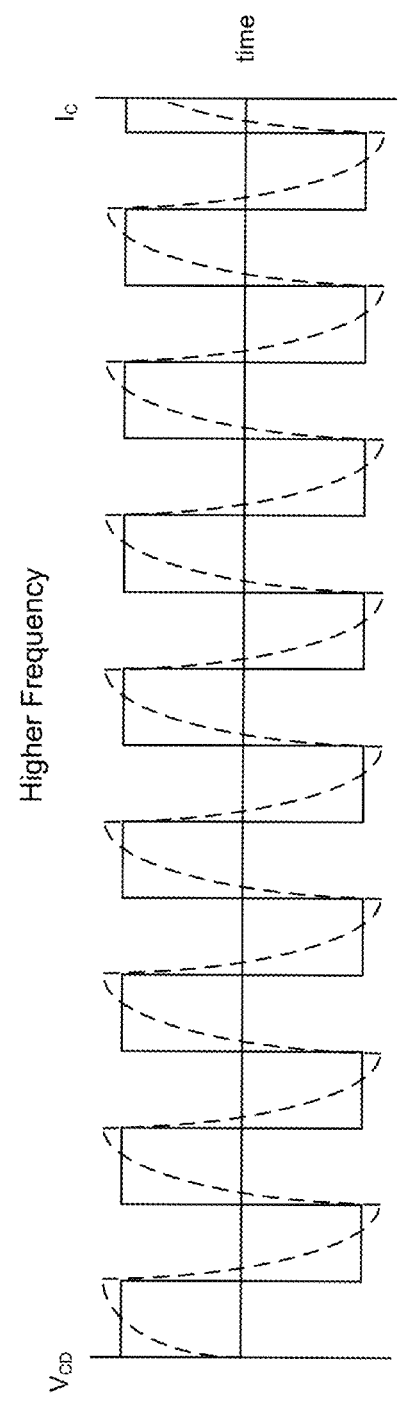
FIG. 2A Lower Frequency
FIG. 2B Higher Frequency
Voltage ——
Current – – –

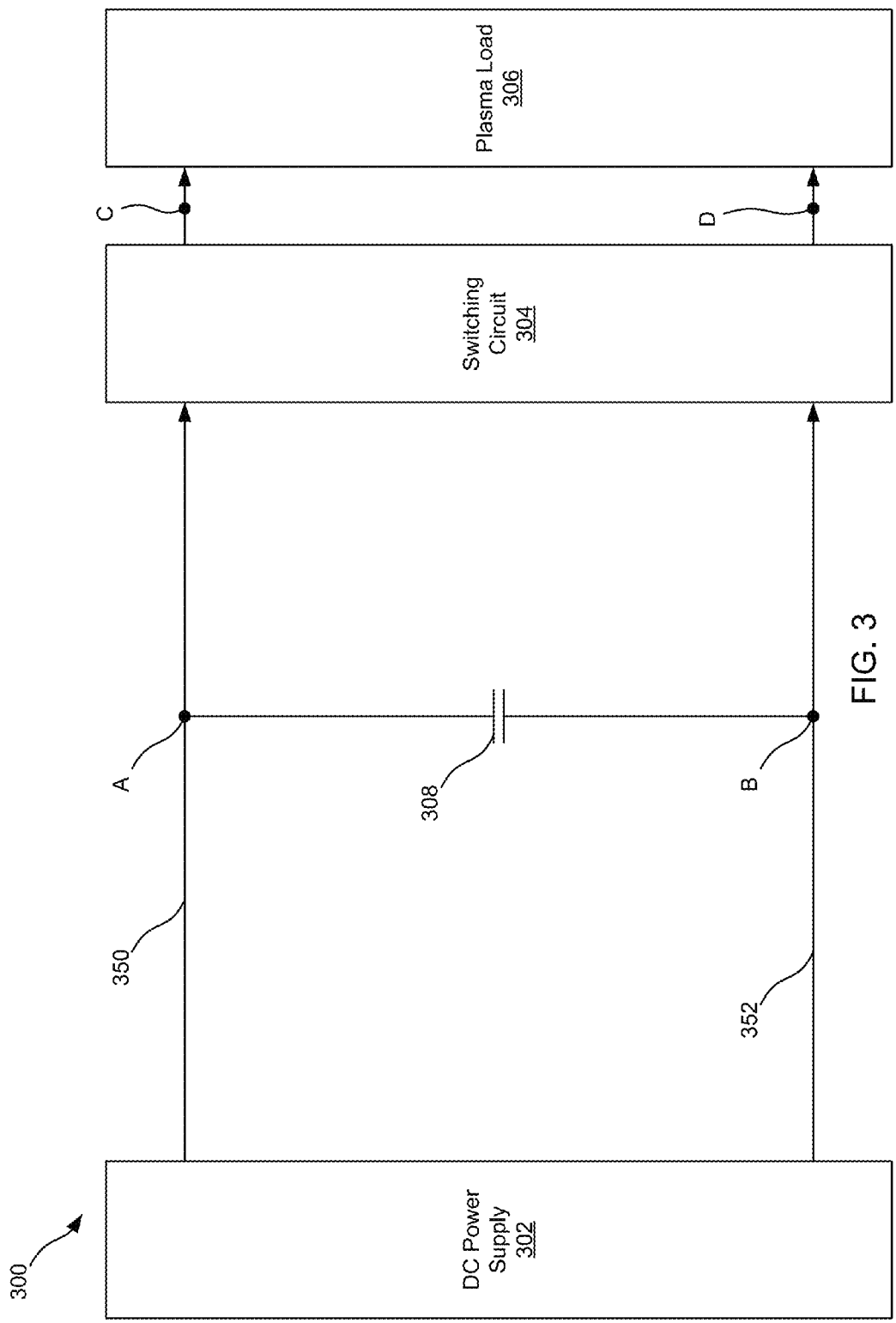

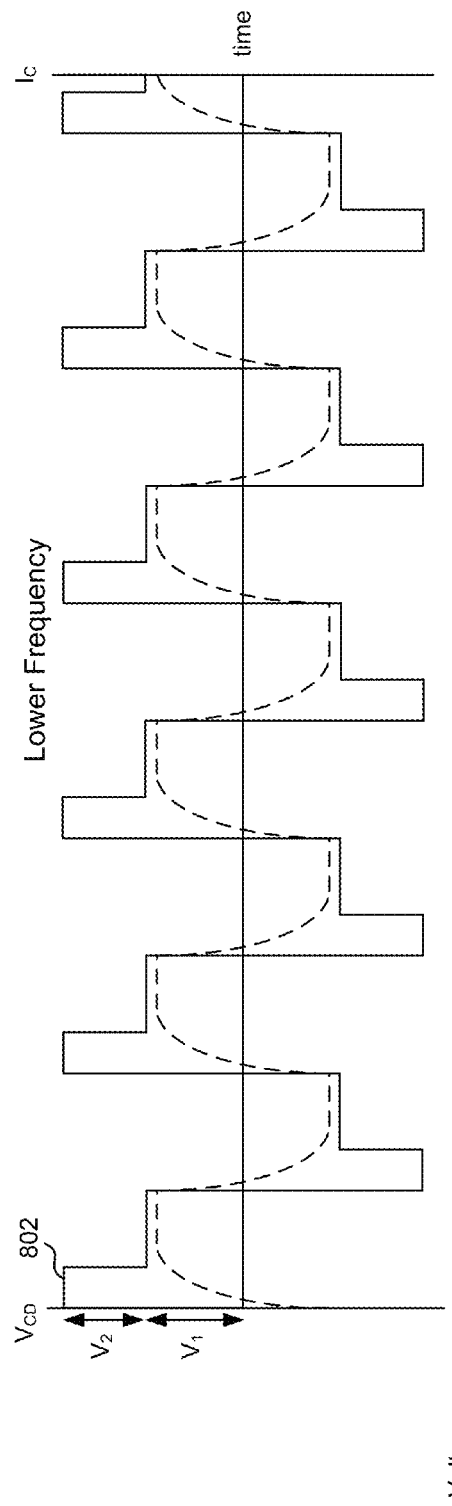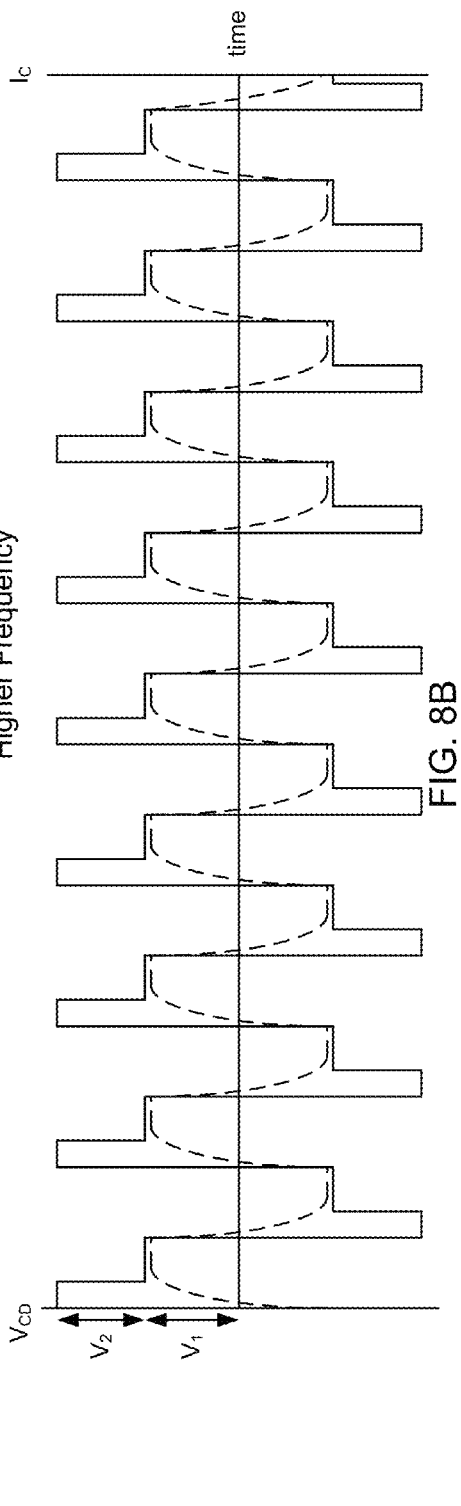
FIG. 8A
FIG. 8B

ADJUSTABLE NON-DISSIPATIVE VOLTAGE BOOSTING SNUBBER NETWORK

CLAIM OF PRIORITY UNDER 35 U.S.C. §120

The present Application for Patent is a Continuation of patent application Ser. No. 14/945,324 entitled "ADJUSTABLE NON-DISSIPATIVE VOLTAGE BOOSTING SNUBBER NETWORK" filed Nov. 18, 2015, pending, and assigned to the assignee hereof and hereby expressly incorporated by reference herein.

FIELD OF THE DISCLOSURE

The present disclosure relates generally to power supplies. In particular, but not by way of limitation, the present disclosure relates to systems, methods and apparatuses for limiting voltage and current spikes in a power supply.

BACKGROUND

FIG. 1 illustrates one example of a typical power supply system 100 used for plasma processing. The power supply system 100 includes a DC power supply 102 providing DC power to a switching circuit 104 that converts the DC power into pulsed DC and provides the pulsed DC to a plasma load 106. When switching, the potential between nodes C and D passes through a potential of zero, and the plasma can be extinguished or can dim to an extent that it becomes highly resistive and acts like an unfluxed inductor or an open circuit for a short time after this transition. Immediately after this transition, the DC power supply 102 continues to provide power to the switching circuit 104, but most of that power can no longer be delivered to the plasma load 106. Instead, the power predominantly passes through the switching circuit 104 potentially damaging the switching circuit 104.

A snubber 108 can be used to mitigate damage to the switching circuit 104 by absorbing power from the DC power supply 102 during the period after the switching circuit 104 transitions through 0 V. However, existing snubbers are typically dissipative snubbers and/or dissipate significant power.

Additional challenges to known power supply systems include slow processing throughput and further inefficiencies from power dissipation. For instance, and as seen in FIG. 2A, while voltage between nodes C and D can switch with negligible ramp time, current ramps at a much slower pace thus providing an average power that is significantly lower than the power output from the DC power supply 102. This leads to longer processing periods and decreased throughput, since many processes can only end when a predetermined total power has been delivered.

There is also a desire to increase DC pulse frequency provided to the plasma load 106 since this reduces arcing. However, the above-noted problems become more acute at higher frequencies, as illustrated in FIG. 2B. Furthermore, since each pulse is shorter at higher frequency, the current at high frequency may end up larger (in a power-regulated system) than at lower frequency. Since power dissipation is proportional to $I^2$, these larger currents lead to larger power losses. Additionally, switching losses, which are proportional to the current at the moment of switching, are accentuated at higher frequencies since switching current is larger.

SUMMARY OF THE DISCLOSURE

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

Some embodiments of the disclosure may be characterized as a power system comprising a DC power supply, a switching circuit, and a snubber circuit. The DC power supply can supply DC power to first and second rails having a voltage between the first and second rails. The switching circuit can receive the DC power via the first and second rails and converting the DC power to a pulsed DC voltage, the pulsed DC voltage configured for application to a plasma load. The snubber circuit can be coupled to the first and second rails such that the voltage between the first and second rails falls across the snubber circuit. Furthermore, the snubber circuit can comprise a first unidirectional switch, a voltage multiplier, an electrical node, and a current limiter. The first unidirectional switch can be configured to allow current to pass from the first rail. The voltage multiplier can be coupled between the first unidirectional switch and the second rail. The voltage multiplier can be configured to absorb and store energy from the DC power supply via the first unidirectional switch when an impedance seen by the switching circuit increases. It can also be configured to boost the voltage between the first and second rails by virtue of absorbing and storing the energy from the DC power supply. It can further be configured to then apply at least a portion of the stored energy to the switching circuit when the impedance seen by the switching circuit decreases and thereby decrease the voltage between the first and second rails. The electrical node can be arranged between the first unidirectional switch and the voltage multiplier. The current limiter can be coupled between the electrical node and the first rail and can limit rises in current that the voltage multiplier discharges to the switching circuit Other embodiments of the disclosure may also be characterized as a snubber circuit comprising a voltage multiplier, a first unidirectional switch, and a first currentlimiter. The voltage multiplier can be coupled between a first power rail and a second power rail and it can absorb and store energy from the first rail and consequently boost a voltage between the first and second rail, and then discharge at least some of the energy and consequently reduce the voltage between the first and second rail. The first unidirectional switch can allow current to pass from the first power rail to the voltage multiplier, but can block current attempting to pass back to the first power rail through the first unidirectional switch. The first current limiter can be coupled between the first power rail and the voltage multiplier. The first current limiter can provide a low-resistance current path from the voltage multiplier to the first power rail and can limit a rate of change of current that the voltage multiplier discharges to the first power rail.

Other embodiments of the disclosure can be characterized as a method comprising passing power from a power supply to a load having an impedance. The method can also include absorbing at least some of the power when the impedance of the load substantially increases and thereby increasing a voltage and a current reaching the load. The method finally includes discharging at least some of the absorbed power into the load when the impedance of the load decreases, such that the discharge is substantially non-dissipative.

BRIEF DESCRIPTION OF THE DRAWINGS

Various objects and advantages and a more complete understanding of the present invention are apparent and more readily appreciated by referring to the following detailed description and to the appended claims when taken in conjunction with the accompanying drawings:

FIG. 1 illustrates one example of a typical power supply system used for plasma processing;

FIG. 2A illustrates a plot of voltage and current for a traditional power supply system;

FIG. 2B illustrates a second plot of voltage and current for a traditional power supply system;

FIG. 3 illustrates a power supply system including a DC power supply, a switching circuit, a plasma load, and an embodiment of a non-dissipative snubber circuit;

FIGS. 8A and 8B illustrate plots of voltage and current for a power supply system according to one embodiment of this disclosure;

DETAILED DESCRIPTION

The present disclosure relates generally to power supply systems. More specifically, but without limitation, the present disclosure relates to a non-dissipative snubber for use in a power supply system.

The word "exemplary" is used herein to mean "serving as an example, instance, or illustration." Any embodiment described herein as "exemplary" is not necessarily to be construed as preferred or advantageous over other embodiments.

For the purposes of this disclosure, a current limiter is any device or circuit that limits a current that can pass through the current limiter or that limits a rate at which current passing through the current limiter can rise or fall. In some embodiments, a current limiter can limit both the rate of increase and an upper bound of the current passing through the current limiter. An inductor, resistor, JFET, MOSFET, and IGBT are all examples of current-limiting elements since each are able to limit the rate of change of and amount of current.

For the purposes of this disclosure, a switch includes any circuit or device that stops the passage of current when in an off or open state. For instance, transistors (e.g., MOSFET, BJT, IGBT) can be a switch, and in some cases, where a current limiter is operated so as to reduce current to 0 A, a current limiter can be a switch.

For the purposes of this disclosure, a unidirectional switch includes any device or circuit that only passes current in a single direction. For instance, both a diode and a transistor can be considered a unidirectional switch, depending on operation.

Figure 24:
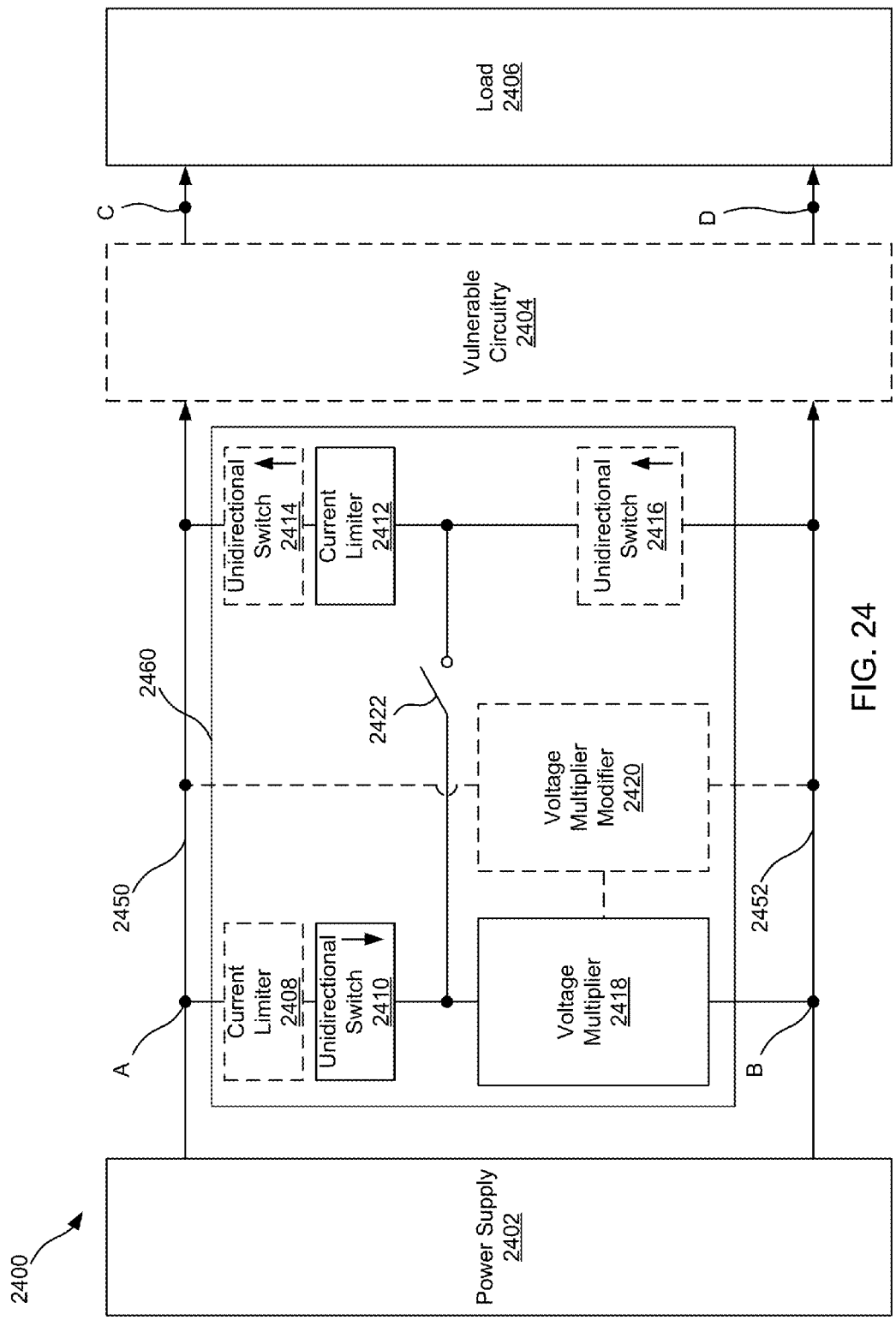
FIG. 24 illustrates yet a further power supply system.

The challenges noted in the background can be dealt with via use of a non-dissipative snubber 2460 as illustrated in FIG. 24, comprising a first unidirectional switch 2410, a voltage multiplier 2418, and a first current limiter 2412. The snubber 2460 can be arranged between a first power rail 2450 and a second power rail 2452, wherein the power rails 2450 and 2452 transfer power from a power supply 2402 to a load 2406 (e.g., a plasma of a plasma processing chamber), and optionally transfer said power through vulnerable circuitry 2404 (e.g., a switching circuit). The first unidirectional switch 2410 can be arranged between a first power rail 2450 and the voltage multiplier 2418 and allows current to pass from the first power rail 2450 to the voltage multiplier 2418 (optionally through a current limiter 2408), but prevents current from traveling a reverse path through the unidirectional switch 2410. The first current limiter 2412 can couple the voltage multiplier 2418 to the first power rail 2450 in parallel to the unidirectional switch 2410 and provides a low-loss current path from the voltage multiplier

2418 to the first power rail 2450. The snubber 2460 may further include a switch 2422 between the voltage multiplier 2418 and the first current limiter 2412, wherein the switch 2422 remains closed during most operations, but is opened when a current in the current limiter 2412 reaches a threshold, and then closes when the current in the current limiter 2412 falls below the threshold.

One advantage of the snubber 2460 is its ability to non-dissipatively absorb energy from the power supply 2402 when an impedance of the load 2406 increases, or substantially increases. For instance, where the load 2406 is a plasma, and the plasma dims or is extinguished, the plasma impedance increases substantially. When the load 2406 impedance increases substantially, the power supply 2402 continues to deliver the same power, and this power would dissipate largely in the vulnerable circuitry 2404. However, the snubber 2460, and in particular, the voltage multiplier 2418, absorbs a large portion of this energy, thus protecting the vulnerable circuitry 2404.

Another advantage of the snubber 2460 is to avoid rapid discharges of the stored energy in the voltage multiplier 2418 when the load 2406 impedance suddenly drops. For instance, where the load 2406 is a plasma, and an arc in the plasma occurs, the arc creates a low impedance current path for the energy in the voltage multiplier 2418. However, the current limiter 2412 prevents rapid discharge of the voltage multiplier 2418. In the case of plasma arcs, this aspect helps prevent the snubber 2460 from exacerbating arcs.

A third advantage of the snubber 2460 is an ability to boost a voltage that the power supply 2402 provides to the load 2406, and consequently boosts a current ramp rate provided to the load 2406. When the voltage multiplier 2418 absorbs energy from the power supply 2402, a voltage across the voltage multiplier 2418 can be raised to some multiple of a voltage between nodes A and B, $V_{AB}$, generated by the power supply 2402. In this way, the voltage multiplier 2418 can boost a voltage, and thus a current ramp rate, provided to the load 2406 after the load 2406 impedance rises. Where there is a desire to control or limit the multiplying effect of the voltage multiplier 2418, (e.g., where one or more devices have a voltage threshold that can be exceeded if the voltage multiplier's full effect is enabled) an optional voltage multiplier modifier 2420 may be utilized (see FIGS. 11-14). The voltage multiplier modifier acts as a 'control knob' over the voltage boost provided by the voltage multiplier 2418.

The power supply 2402 can be embodied by a current source or other current-regulating power supply. In one embodiment, the power supply 2402 can be any power supply having an output current that is limited to slow changes in current. For instance, the power supply 2402 can be any power supply having an inductive output behavior. The power supply 2402 may be able to raise its compliance voltage, and hence the voltage $V_{AB}$. The ability to raise the compliance voltage, and hence, $V_{AB}$, can further enable turn-on of the unidirectional switch 2410.

Figure 7:
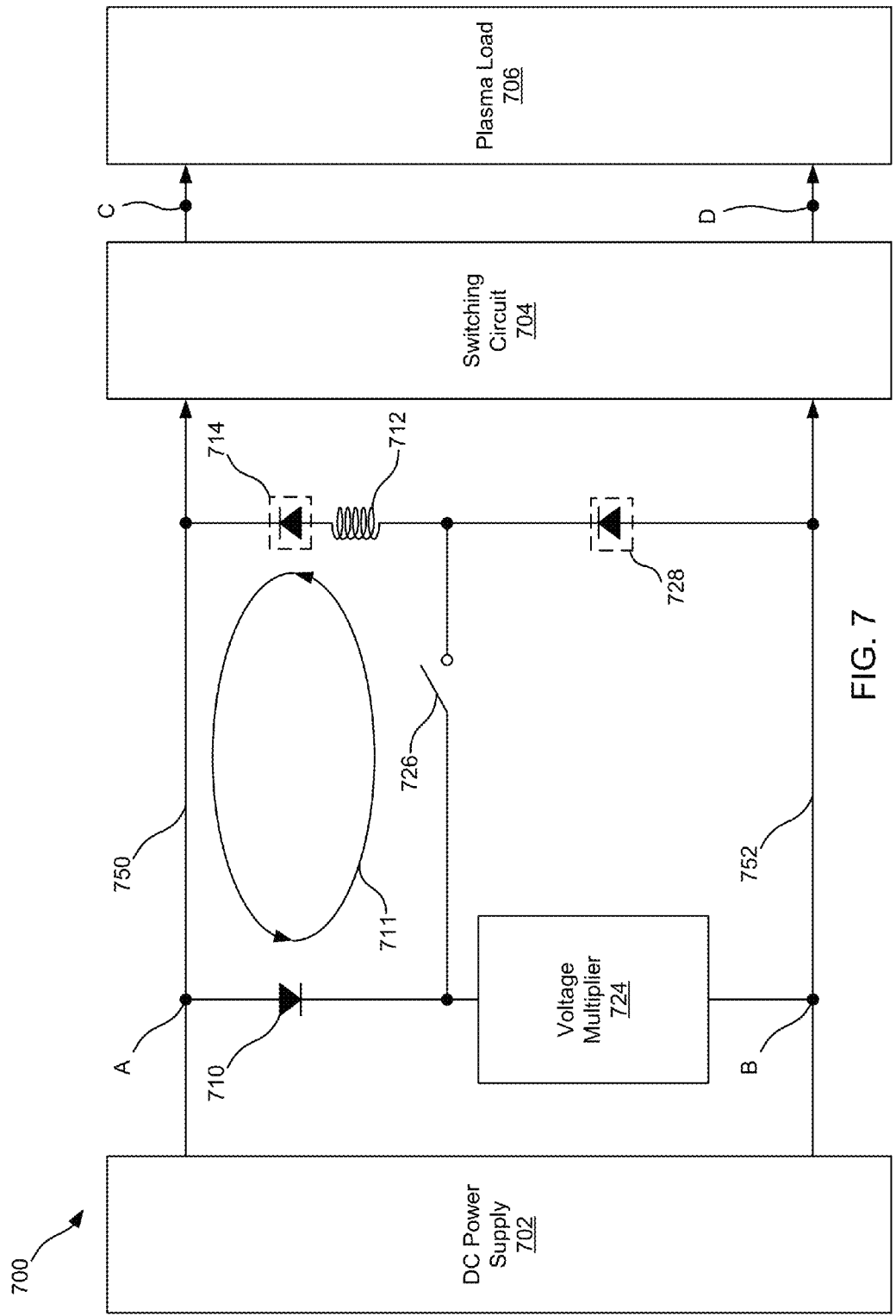
FIG. 7 illustrates a power supply system including a DC power supply, a switching circuit, a plasma load, and yet another embodiment of a non-dissipative snubber circuit.

The snubber 2460 has particular application to pulsed DC power systems providing pulsed DC power to a plasma load during plasma processing. For instance, and as illustrated in FIG. 7, a non-dissipative snubber can be arranged between a DC power supply 702 (e.g., power supply 2402) and a switching circuit 704 (e.g., vulnerable circuitry 2404) providing pulsed DC voltage to a plasma load 706 (e.g., load 2406). In this application, the non-dissipative snubber absorbs power from the DC power supply 702 when the plasma load 706 impedance rises such that power would otherwise damage the switching circuit 704 (e.g., immediately after the switching circuit voltage transitions through 0 V), avoids excessive current discharge during arc events in the plasma, and increases a ramp rate of current provided to the plasma load 706 during each voltage pulse. These advantages can be especially beneficial for high frequency pulsing and high power applications.

The non-dissipative snubber includes a voltage multiplier 724 that temporarily boosts a voltage $V_{AB}$ and thus a current provided to the switching circuit 704 in order to increase an average power delivered to the plasma load 706, thereby increasing throughput, and decreasing losses from excessive currents. The non-dissipative snubber can also include an inductor 712 to prevent the voltage multiplier 724 from rapidly discharging stored energy into the switching circuit 704 and the plasma load 706 when the plasma load 706 drops (e.g., during an arc). The snubber circuit may further include a switch 726 between the voltage multiplier 724 and the inductor 712 to help stop runaway current ramping in the inductor 712 caused by high-frequency multiple arc events in the plasma (e.g., rapid succession of arcs). Various diodes 710, 714, and 728 and capacitors can be interleaved with the above-noted components in order to control the direction of currents in the non-dissipative snubber and various capacitors can be used to store energy.

Figure 6:
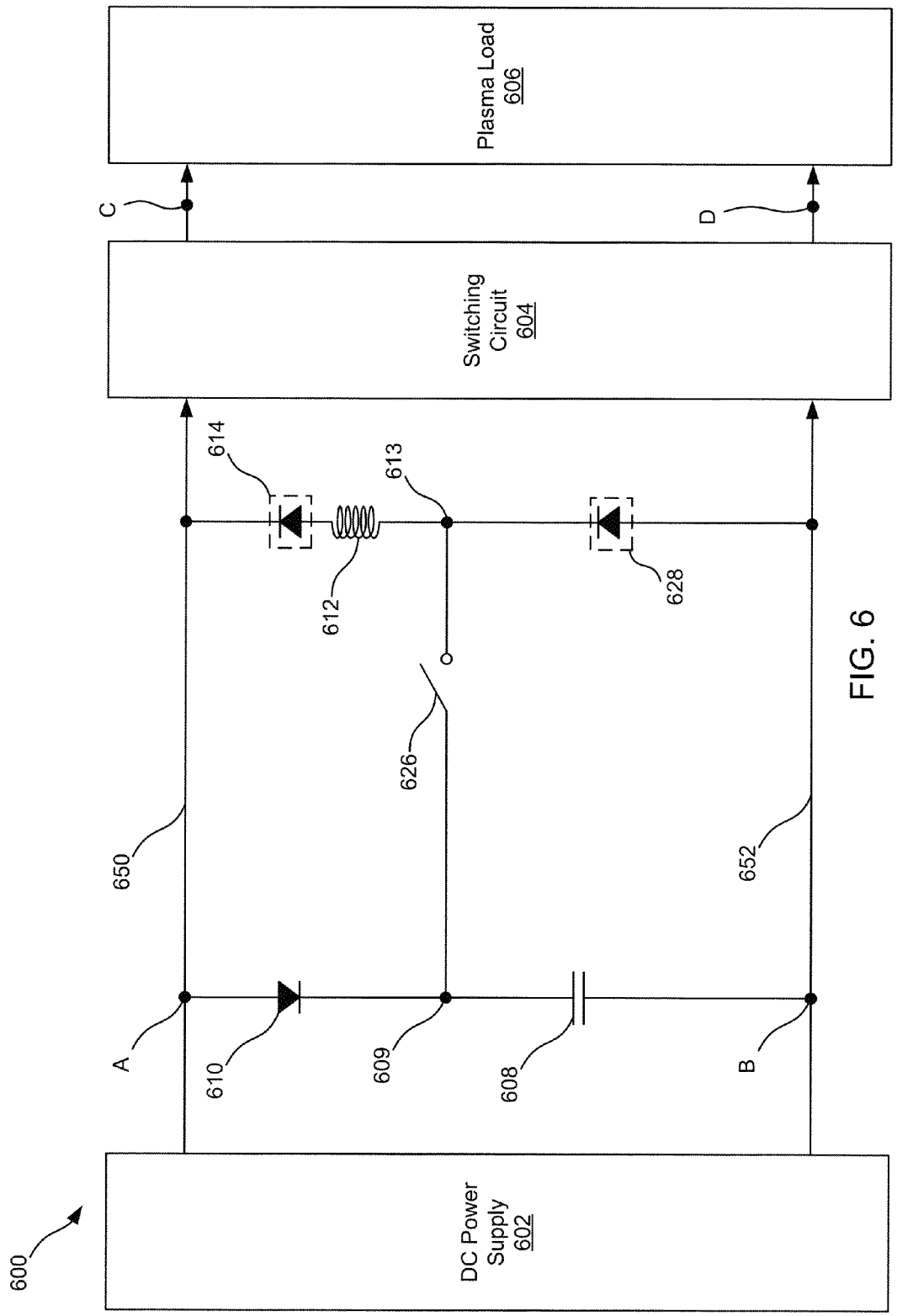
FIG. 6 illustrates a power supply system including a DC power supply, a switching circuit, a plasma load, and yet another embodiment of a non-dissipative snubber circuit.

In one embodiment, a capacitor can replace the voltage multiplier 724 (see FIG. 6). In one embodiment, the voltage multiplier 724 can be a voltage doubler (see FIG. 9), a voltage tripler (see FIG. 10), or any other multiplier having an integer or fractional multiplying effect.

Before delving deeper into FIGS. 7 and 24, a discussion of the development of these circuits and power systems may be helpful. FIG. 3 illustrates a power supply system 300 including a DC power supply 302, a switching circuit 304, a plasma load 306, and an embodiment of a non-dissipative snubber circuit. The DC power supply 302 provides DC power to the switching circuit 304 (e.g., a half-bridge switching circuit) which converts the DC power to pulsed DC that is then provided to the plasma load 306. In order to prevent damage to the switching circuit 304 during switching, when the plasma load 306 appears as a capacitor or open circuit, a snubber circuit including a capacitor 308 coupled between a first rail 350 (positive rail) and a second rail 352 (negative rail) can be implemented. While the capacitor 308 can limit current and/or voltage spikes in the switching circuit 304, it unfortunately also quickly discharges stored energy into arcs in the plasma, thus exacerbating such events.

Figure 4:
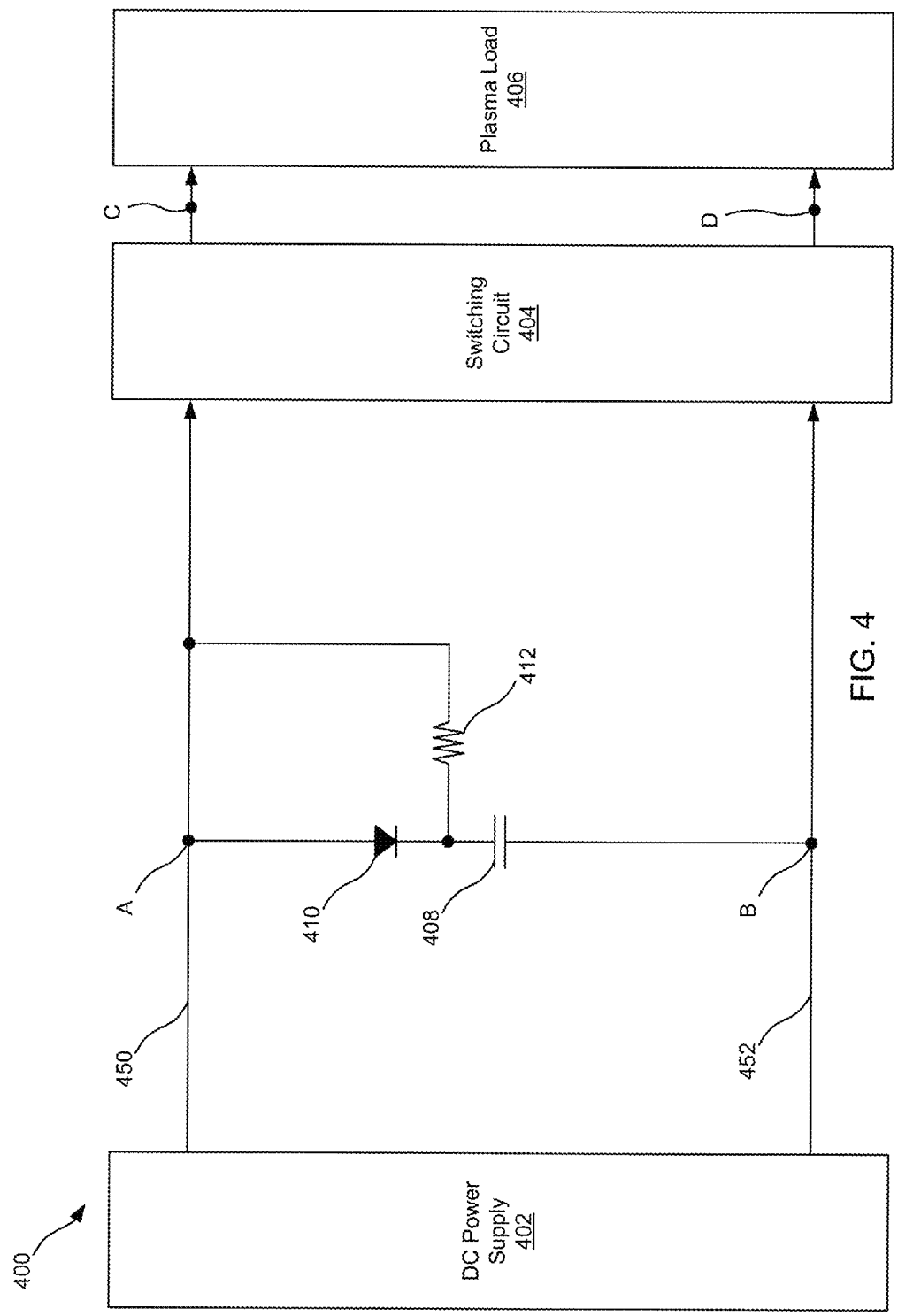
FIG. 4 illustrates a power supply system including a DC power supply, a switching circuit, a plasma load, and another embodiment of a dissipative snubber circuit.

FIG. 4 illustrates a power supply system 400 including a DC power supply 402, a switching circuit 404, a plasma load 406, and another embodiment of a dissipative snubber circuit. In this embodiment the snubber circuit includes a diode 410, a capacitor 408, and a resistor 412. During switching circuit 404 switching, when the plasma load 406 appears as a capacitor or open circuit, a majority of power from the DC power supply 402 passes through the diode 410 and charges the capacitor 408. The capacitor 408 can discharge its energy through the resistor 412 to the switching circuit 404 in the plasma load 406 when the plasma load 406 impedance returns to typical levels. Unlike the snubber illustrated in FIG. 3, the snubber of FIG. 4 limits the current that the capacitor 408 discharges to the first rail 450 via the resistor 412, whose resistance can be selected to meet a maximum current threshold. However, power is dissipated as current passes through the resistor 412, and thus this design is merely a dissipative snubber.

Figure 5:
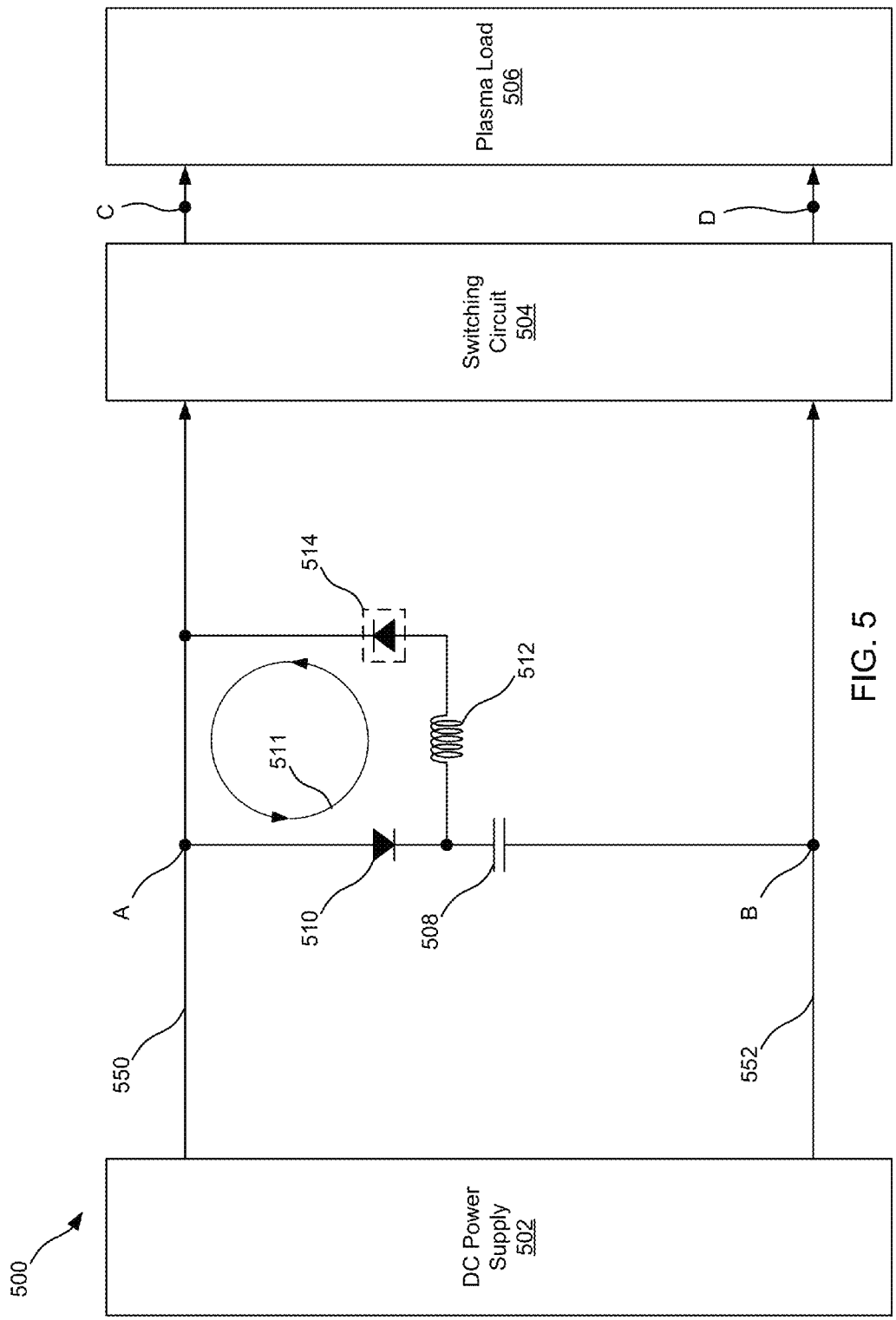
FIG. 5 illustrates a power supply system including a DC power supply, a switching circuit, a plasma load, and yet another embodiment of a non-dissipative snubber circuit.

FIG. 5 illustrates a power supply system 500 including a DC power supply 502, a switching circuit 504, a plasma load 506, and yet another embodiment of a non-dissipative snubber circuit. However this design replaces the resistor 412 in FIG. 4 with an inductor 512, thus enabling the capacitor 508 to discharge stored energy in a non-dissipative fashion. In this case, power from the DC power supply 502 can pass through the diode 510 (or any unidirectional switch) and charge the capacitor 508 (or any capacitive circuit or device, such as a capacitor) when the switching circuit 504's switching of the plasma load 506 appears as a capacitor or an open circuit. Energy stored in the capacitor 508 can be discharged through the inductor 512 (or any inductive circuit or device), the switching circuit 504, and to the plasma load 506 without the losses incurred by passing said energy through a resistor. At the same time, like the resistor 412, the inductor 512 limits the rate of increase in current thus preventing the capacitor 508 from dangerously discharging its energy during arcing events.

In an optional embodiment the snubber can include a diode 514 (or any unidirectional switch) arranged between the inductor and the first rail 550 that prevents current from charging the capacitor 508 through the inductor 512. This diode 514 may be required since the inductor 512, rather than the diode 610, is the path of least resistance from the first rail 550 to the capacitor 508. The inductor-capacitor (512-508) combination can also lead to ringing, and thus the optional diode 514 helps to alleviate this ringing.

However, since the inductor 512 and diode 510 (and optionally the diode 514) are arranged in a near-lossless current loop 511, current in the inductor 512 continues to flow with little or no dissipation. Every time an arc occurs, the capacitor 508 discharges some energy in the form of current through the inductor 512, and then recharges after the arc. The added current builds upon the already looping current, and if the rate of arcing is high enough, then the current in the inductor 512 can step wise build in a runaway current ramp until the current in this loop 511 damages or destroys either or both of the diodes 510 and 514.

In some embodiments, a bank of capacitors can replace the capacitor 508 such that smaller and less expensive capacitors can be used to achieve a large capacitance.

FIG. 6 illustrates a power supply system 600 including a DC power supply 602, a switching circuit 604, a plasma load 606, and yet another embodiment of a non-dissipative snubber circuit. In this case, a switch 626 can be arranged between an electrical node 609 (between a diode 610 and a capacitor 608) and an inductor 612. The switch 626 can remain closed during normal processing, but be opened during arc events in order to cut the near-lossless current loop formed by the inductor 612 and the diode 610 (and optionally a diode 614). Thus, when high-frequency arc events occur, a current in the inductor 612 may stepwise rise as a result of each successive discharge from the capacitor 608. When the current reaches a threshold, the switch 626 opens, and the current passes into the capacitor 608 via diode 610 thus providing a current path for the inductor to discharge through until the energy stored in the inductor's magnetic field falls and the current in the inductor 612 drops below the threshold. This prevents the runaway current ramp in the inductor 612 that was described with reference to FIG. 5.

Optionally, the snubber can include a diode 628 (or other unidirectional switch) arranged between an electrical node 613 and the second rail 652. The electrical node 613 is arranged between the switch 626 and the inductor 612. The optional diode 628 is forward biased when the switch 626 opens, thus providing a current path from the second power rail 652 to the inductor 612 and thus enabling the inductor 612 to continue to draw current when the switch 626 opens. This avoids voltage spikes across the inductor 612. At the same time, the diode 628 is reverse biased when the switch 626 is closed, thus preventing current from passing to the second power rail 652 after passing through the switch 626.

In some embodiments, a bank of capacitors can replace the capacitor 608 such that smaller and less expensive capacitors can be used to achieve a large capacitance.

FIG. 7 illustrates a power supply system 700 including a DC power supply 702, a switching circuit 704, a plasma load 706, and yet another embodiment of a non-dissipative snubber circuit. Here, a voltage multiplier 724 replaces the capacitor seen in earlier snubber embodiments. The voltage multiplier 724 is designed to improve the efficiency of the system 700, while still enabling the snubber to absorb power from the DC power supply 702 and thus protect the switching circuit 704.

In particular, and recalling FIGS. 2A and 2B, pulsed DC power systems often suffer from slow current ramp rates during each pulse. The voltage multiplier 724 absorbs power from the DC power supply 702 after the switching circuit 704 voltage switches, but also boosts process voltage, $V_1$, for a first portion 802 of each pulse so that current ramps faster as illustrated in FIG. 8A. For instance, the DC power supply 702 provides sufficient power to enable the process voltage $V_1$, but the voltage multiplier 724 boosts this voltage by $V_2$ during the first portion 802 of each pulse.

This voltage boost is actually a byproduct of the snubber circuit absorbing power from the DC power supply 702 immediately after 0 V transitions of the switching circuit 704. When the switching voltage reaches 0 V, the plasma density drops substantially and the plasma acts more like an open circuit or an unfluxed inductor than as a low resistance current path. The DC power supply 702 is current or power regulated and thus continues to drive the same current level. The snubber circuit absorbs this power, which otherwise would be directed into the switching circuit 704 and potentially damage that circuit.

As current passes into the voltage multiplier 724, energy is stored within the voltage multiplier 724 and accumulates along with a voltage that is increasingly larger than the process voltage $V_2$ until the current in the plasma has ramped sufficiently to raise the plasma density back to a level where power can again be largely provided to the plasma load 706 rather than to the snubber. This time is long enough that the voltage across the voltage multiplier 724 builds to greater than the process voltage, $V_1$, and thus for a first portion 802 of each DC pulse, there is a voltage boost of $V_2$ as seen in FIG. 8A.

This increased voltage causes the current to ramp faster than seen in the art (e.g., FIG. 2A). As a result, the current flattens out sooner in each pulse meaning that greater average power is delivered and thus less time is required for a given process. The increased current ramp rate also means that current does not rise as high as it would given a slower ramp rate, which results in less overall losses (proportional to $I^2$) and less switching losses (proportional to I at the moment of switching). These improvements in efficiency are especially noticeable at higher frequencies (see FIG. 8B and compare to FIG. 2B).

It should be noted that FIG. 8A is a simplification of the voltage and current waveforms, and in practice the vertical rises and falls may have non-infinite slopes caused by capacitive and inductive effects.

If the voltage between the first rail 750 and the second rail 752 falls below approximately the process voltage, $V_1$, then the voltage multiplier 724 can partially discharge and supplement the current provided from the DC power supply 702 at approximately the process voltage, $V_1$.

During arcs, the voltage multiplier 724 can also discharge some of its energy through the closed switch 726 and the inductor 712. A near-lossless current loop 711 may then be established through the inductor 712, the diode 710, and the closed switch 726 (and optionally the diode 714) until the switch 726 is opened, thus forcing the current to recharge the voltage multiplier 724.

In some embodiments, $V_2=V_1$ (e.g., the voltage multiplier 724 is a voltage doubler). However, in other embodiments, $V_2$ can be less than or greater than the process voltage, $V_1$. In some embodiments, $V_2$ can even be variable (see FIGS. 11-14).

In some embodiments, the first diode 710 can be arranged in series with a current limiter such as an inductor (not illustrated) so as to limit not only the direction of current into the voltage multiplier 724, but to also limit the amount and rate of change of current entering the voltage multiplier 724. Such a current limiter may be implemented to prevent current overload in the voltage multiplier 724. In embodiments, where two or more of the herein disclosed snubbers are arranged in parallel, the current limiter may limit the current entering each of the snubbers so that voltage can remain at a reasonable level while still sending current to each of the two or more snubbers.

In such an embodiment, the current limiter in series with the first diode 710 can be selected so that current is able to rapidly enter and charge the voltage multiplier 724, while the inductor 712 can be selected so that the voltage multiplier 724 discharges at a lower current. This can lead to a rapid boosting of voltage to $V_1+V_2$ at the start of each DC pulse (see the first portion 802 of FIGS. 8A and 8B) while the voltage multiplier 724 supplements the DC power supply 702 current at $V_1$ over a longer second portion of each DC pulse.

In one embodiment, the first and second rails 750 and 752 are floating, such that neither is referenced to ground.

The diode 714 can be optional where the LC time constant is long. A "long" LC time constant is one where the inductor 712 current is prevented from reversing direction. In particular, the inductor 712 is sinusoidal without the optional diode 714, and so the LC time constant is equal to the switching frequency of the switching circuit 704 and preferably an order of magnitude greater than the switching frequency of the switching circuit 704. The LC time constant can be calculated from the inductance of the inductor 712 and any capacitance of the voltage multiplier 724.

The switching circuit 704 takes either DC voltage or constant power from the DC power supply 702 and generates pulsed DC power. Two non-limiting examples of the switching circuit 704 are an H-bridge (half or full bridge) or a double-pole double-throw switch network.

The plasma load 706 can be part of a plasma processing chamber, such as those used in plasma sputtering. Power can be provided to the plasma load 706 via one or more electrodes such as those in dual-magnetron sputtering (one or more magnetrons can also be used).

Figure 9:
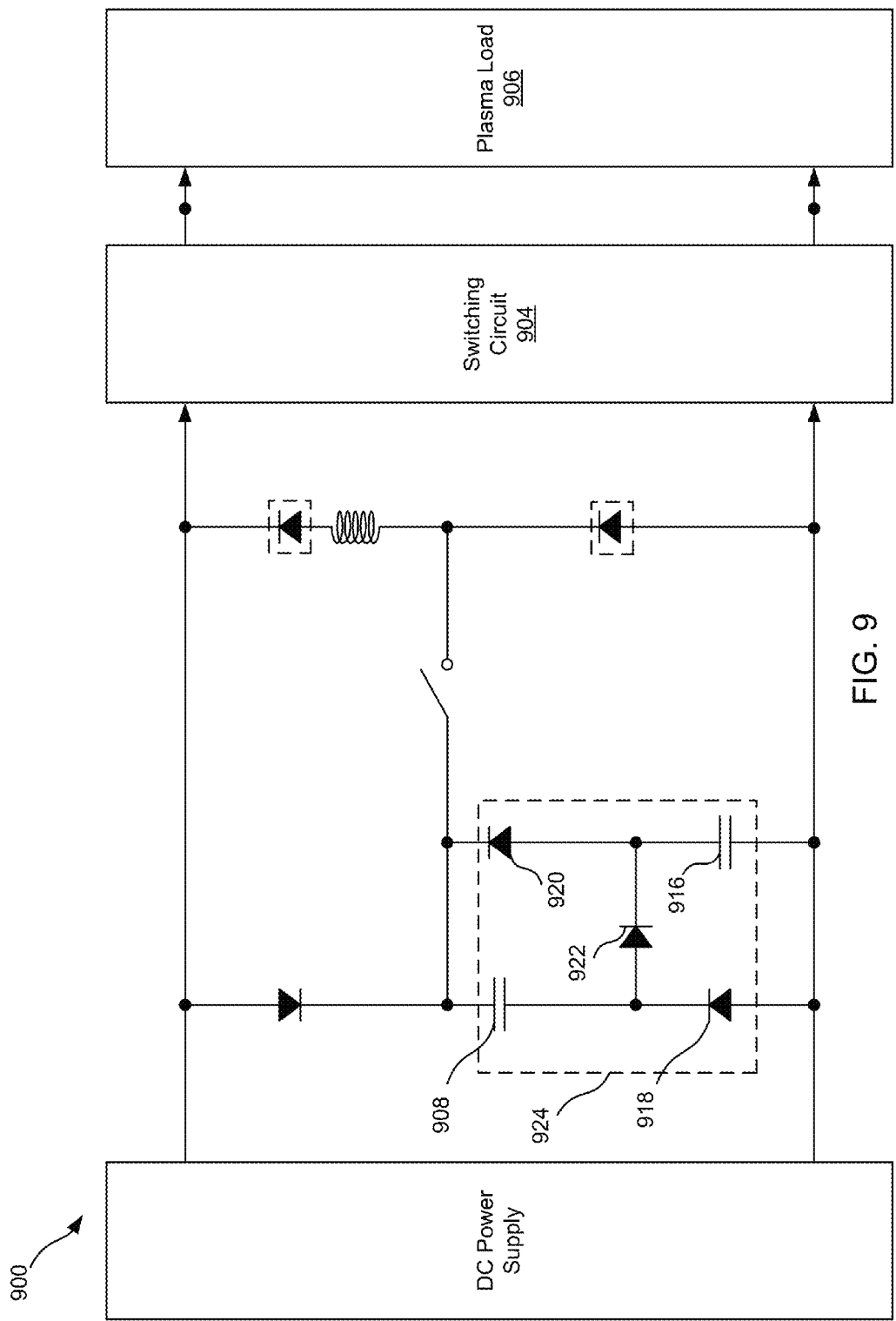
FIG. 9 illustrates an embodiment of a power supply system showing details of a voltage multiplier.

FIG. 9 illustrates an embodiment of a power supply system 900 showing details of a voltage multiplier 924. The voltage multiplier 924 includes a first capacitor 908 (or a capacitor bank or any capacitive element or system), a second capacitor 916, a first diode 918, a second diode 922, and a third diode 920. The first and second capacitors 908 and 916 can be charged in series when the second diode 922 is forward biased. The first and second capacitors 908 and 916 can then discharge in parallel when the first and third diodes 918 and 920 are forward biased, and the second diode 922 is reverse biased.

Figure 10:
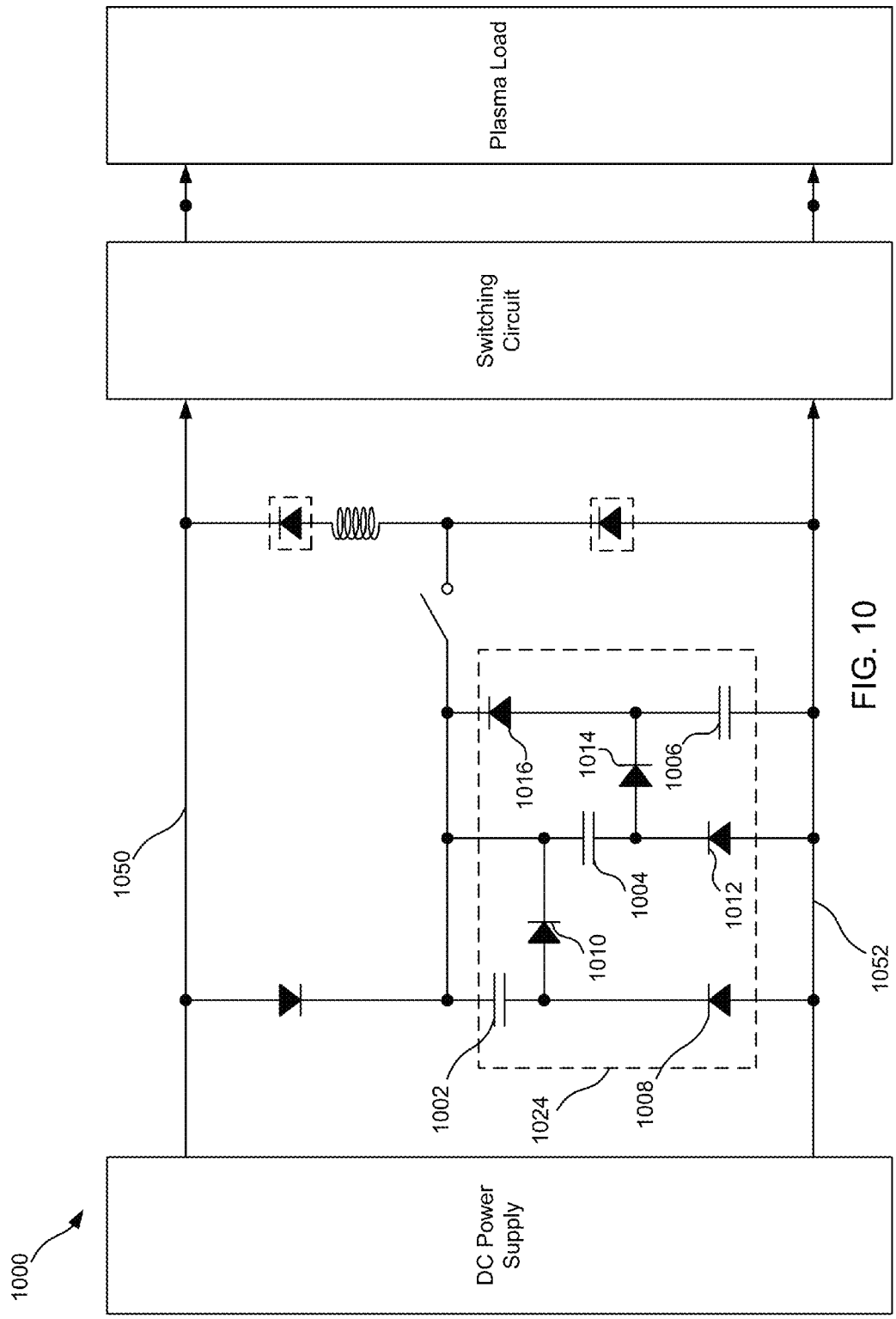
FIG. 10 illustrates an embodiment where the voltage multiplier of the snubber is a voltage tripler.

FIG. 10 illustrates an embodiment where the voltage multiplier of the snubber is a voltage tripler. The voltage multiplier 1024 includes a first capacitor 1002, a second capacitor 1004, and a third capacitor 1006. The voltage multiplier 1024 further includes a first diode 1008, a second diode 1010, a third diode 1012, a fourth diode 1014, and a fifth diode 1016. Each of the capacitors 1002, 1004, 1006 can be charged to near or greater than the process voltage, and therefore when all three are charged, a voltage drop across all three is around three times the process voltage. Thus, the voltage multiplier 1024 is able to boost the voltage across the first and second rails 1050, 1052 by a factor of about three and can therefore be referred to as a voltage tripler.

In some embodiments, a bank of capacitors can replace the capacitors 1002, 1004, and 1006 such that smaller and less expensive capacitors can be used to achieve a large capacitance.

Figure 11:
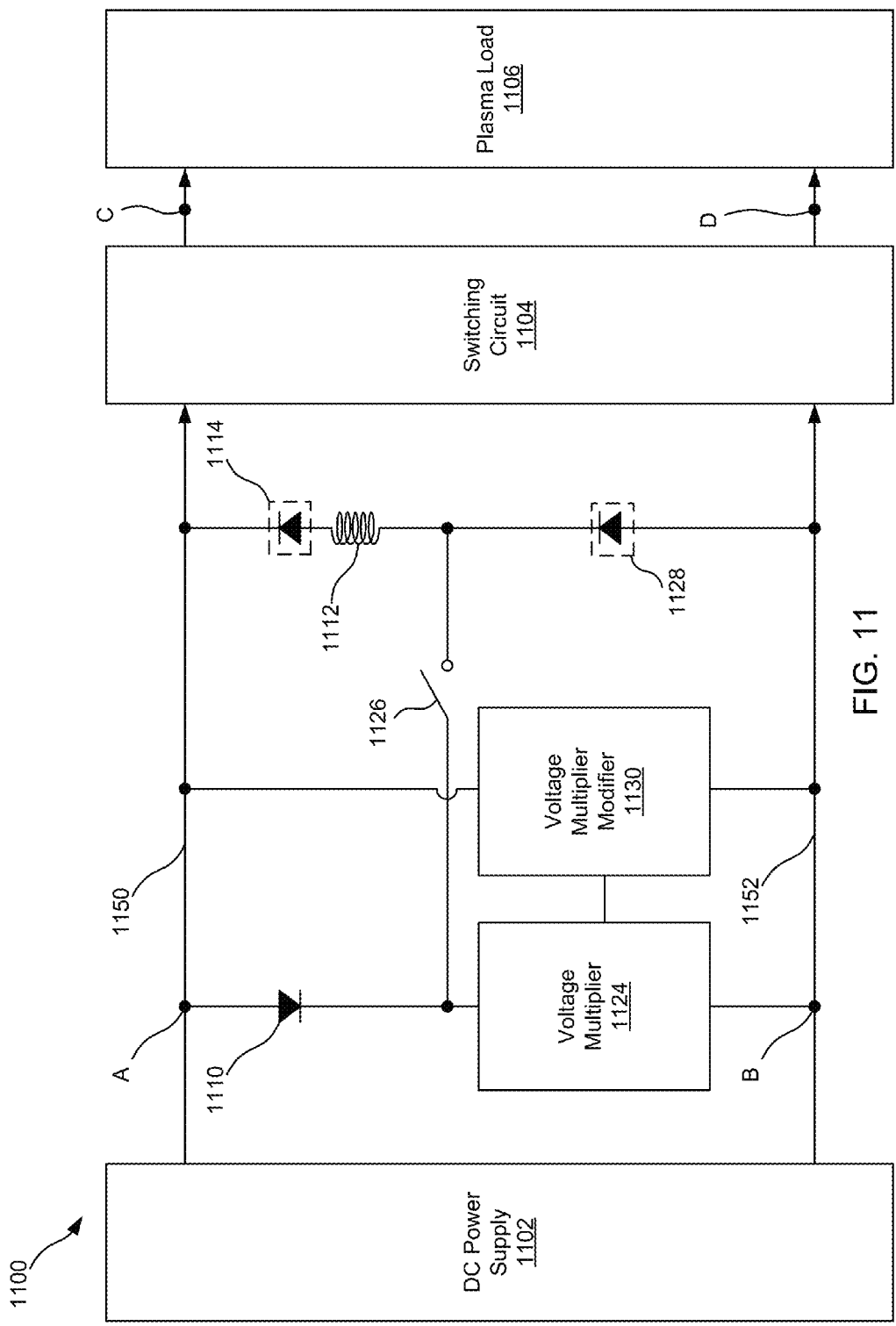
FIG. 11 illustrates a power supply system including a DC power supply, a switching circuit, a plasma load, yet another embodiment of a snubber circuit, and a voltage multiplier modifier.

FIG. 11 illustrates a power supply system 1100 including a DC power supply 1102, a switching circuit 1104, a plasma load 1106, yet another embodiment of a snubber circuit 1124, and a voltage multiplier modifier 1130. Here, the snubber sees the addition of a voltage multiplier modifier 1130 coupled between a first and second rail 1150, 1152, and having an electrical connection to the voltage multiplier 1124. The voltage multiplier modifier 1130 can control the effect of the voltage multiplier 1124 on the voltage, $V_{AB}$, between the rails 1150 and 1152. In this way the boost voltage $V_2$ (see FIG. 12) can be tailored to a desired amplitude that is less than the maximum boost that the voltage multiplier 1124 is capable of. Furthermore, the voltage $V_2$ can be varied in time. This embodiment has particular application where the voltage multiplier 1124 has a fixed multiplying effect (e.g., a voltage doubler or a voltage tripler).

Figure 12:
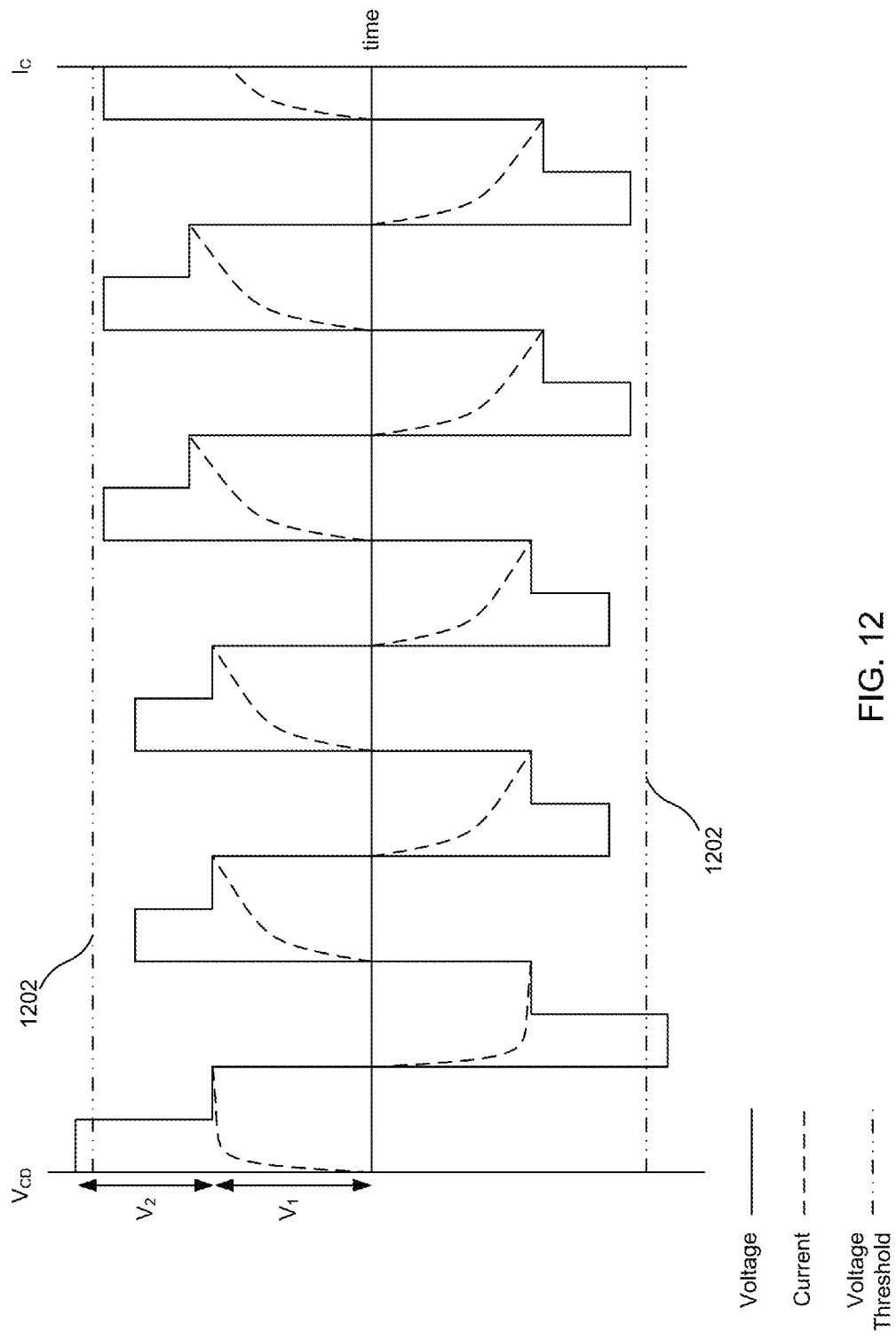
FIG. 12 illustrates a plot of voltage and current for a power supply system according to one embodiment of this disclosure.

One application of such control is illustrated in FIG. 12, where a voltage threshold 1202 shows a threshold above which circuitry in the power supply system 1100 can be damaged. As such the voltage multiplier modifier 1130 can be used to lower $V_2$ so that the total voltage ($V_2+V_1$) of the first portion 802 of the pulses remains below the voltage threshold 1202. As seen, $V_2$ can be adjusted in time so long as the sum is kept below the voltage threshold 1202.

Figure 13:
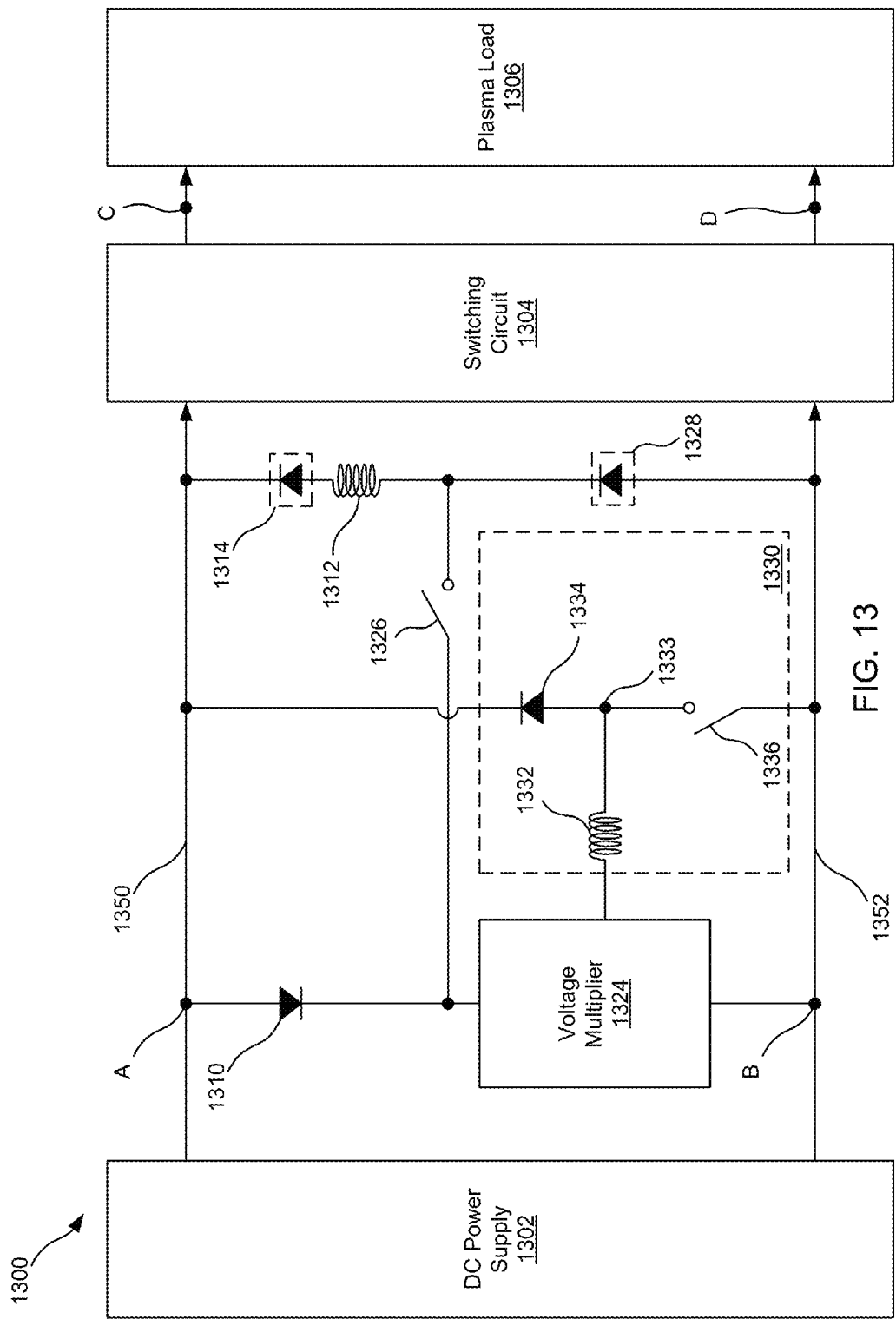
FIG. 13 illustrates a power supply system showing details of one embodiment of a voltage multiplier modifier.

FIG. 13 illustrates a power supply system showing details of one embodiment of a voltage multiplier modifier. The voltage multiplier modifier 1330 can include a diode 1334, an inductor 1332, and a switch 1336. The combination of the inductor 1332, the switch 1336, and the diode 1334 can function as a discontinuous conduction mode (DCM) boost converter, where the inductor 1332 current can fall to zero for at least a portion of operation. The combination can also function as a continuous conduction mode (CCM) boost converter, where the inductor 1332 current never falls to zero.

The inductor 1332 can be arranged between the voltage multiplier 1324 and an electrical node 1333, where the electrical node 1333 is arranged between the diode 1334 and the switch 1336. In particular the electrical node 1333 can be arranged between an anode of the diode 1334 and the switch 1336. The switch 1336 can be arranged between the electrical node 1333 and a second rail 1352. When the switch 1336 closes, stored energy in the voltage multiplier 1324 is removed through the inductive component 1332 and the unidirectional switch 1334 to the first rail 1350, thus lowering the voltage across the voltage multiplier 1324 and hence lowering the voltage boost $V_2$ caused by energy storage in the voltage multiplier 1324.

The switch 1334 can be turned on and off according to a duty cycle, where a larger duty cycle decreases the voltage boost $V_2$ from the voltage multiplier 1324. For instance, a 0% duty cycle (the switch 1334 open 100% of the time) allows the full voltage boost $V_2$ of the voltage multiplier 1324 to reach the switching circuit 1304.

Figure 14:
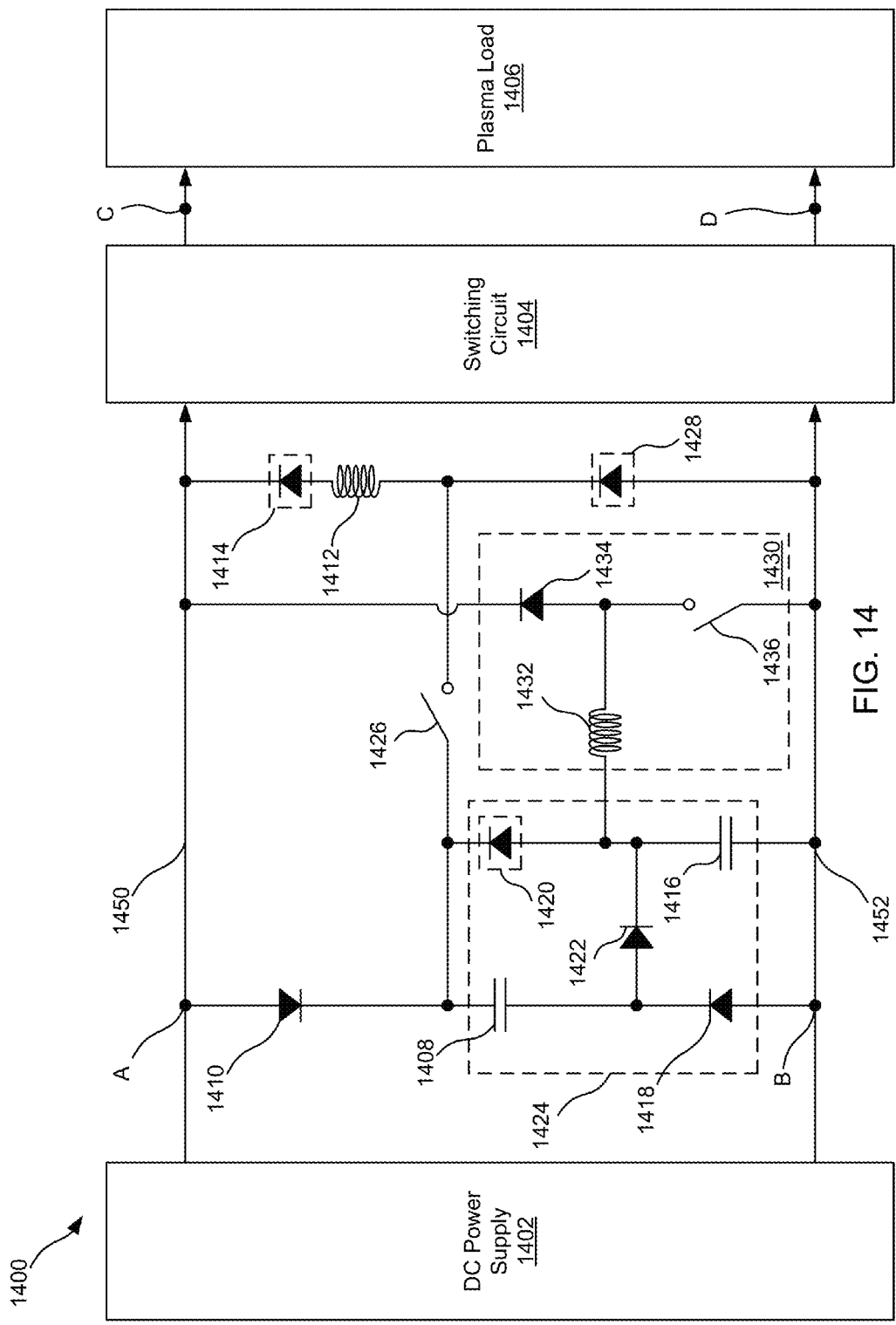
FIG. 14 illustrates a power supply system showing details of one embodiment of a voltage multiplier and of a voltage multiplier modifier.

FIG. 14 illustrates a power supply system showing details of one embodiment of a voltage multiplier 1424 and of a voltage multiplier modifier 1430. The details of the voltage multiplier modifier 1430 are the same as those illustrated in FIG. 13, and the details of the voltage multiplier 1424 are the same as those illustrated in FIG. 9. The voltage multiplier 1124 can include a first capacitor 1480, a second capacitor 1416, a first diode 1418, a second diode 1422, and an optional third diode 1420.

During switching of the switching circuit 1404 when the plasma load 1406 appears as a capacitor or an open circuit, power from the DC power supply 1402 passes through the diode 1410 and into the voltage multiplier 1424. Due to the arrangement of the diodes 1418, 1422, 1420 the current charges the first capacitor 1480 and the second capacitor 1416 in series while passing through the diodes 1410 and 1422. The diode 1418 and the optional diode 1420 are reverse biased during charging of the first and second capacitors 1408, 1416.

When the voltage multiplier 1424 discharges, and the voltage multiplier module 1430 is not active, the second diode 1422 is reverse biased and the first diode 1418 and the optional third diode 1420, if implemented, are forward biased. As a result, the first and second capacitors 1408 and 1416 discharge in parallel. The voltage that the first and second capacitors 1408 and 1416 are each charged to can be equivalent to the process voltage, $V_2$, minus a forward bias voltage drop across the diode 1410. In other words, the voltage multiplier 1424 approximately doubles the voltage provided by the DC power supply 1402, and can be referred to as a voltage doubler.

The voltage multiplier modifier 1430 can control how much of the voltage doubling effect the voltage multiplier 1424 has on $V_{AB}$. For instance, where the switch 1426 has a voltage threshold of 1700 V, and $V_1$ is 1000 V, the voltage multiplier module 1424 by itself would generate a 2000 V rail voltage on the first rail 1450 and thus damage the switch 1426. However, via proper control of the voltage multiplier modifier 1430 the multiplying effect of the voltage modifier 1424 can be tailored such that $V^{AB}$ is kept below 1700 V, thus avoiding damage to the switch 1426.

In particular, when the switch 1436 is closed, energy from the capacitor 1416 is removed to the second rail 1452 via the inductor 1432 and the closed switch 1436. As such, the more often the switch 1436 is closed (e.g., a higher duty cycle), the lower the voltage on the capacitor 1416. The voltage multiplier modifier 1430 does not affect the voltage on the capacitor 1408. In this fashion, the voltage multiplier modifier 1430 can control the boost voltage $V_2$ provided by the voltage multiplier 1424.

When the first and second capacitors 1408, 1416 discharge, and the voltage multiplier modifier 1430 is active, the first capacitor 1408 discharges via the switch 1426, the inductor 1412, and the optional diode 1414. Because charge has been removed from the second capacitor 1416, the optional diode 1420 is reverse biased, and can be removed from the circuit when the voltage multiplier modifier 1430 is used. The second capacitor 1416 discharges through the voltage multiplier modifier 1430, and in particular through the inductor 1432 and the diode 1434.

Figure 17:
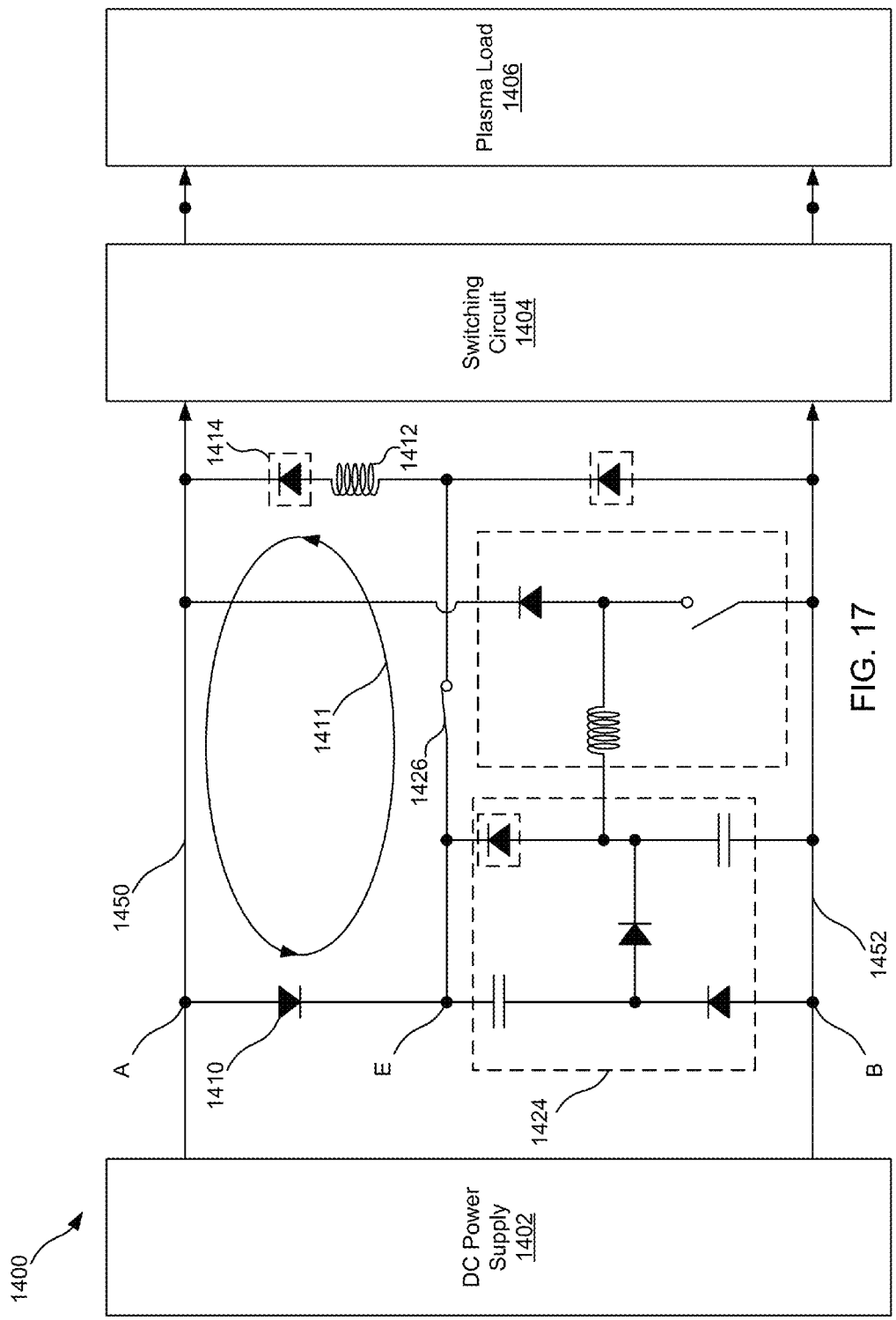
FIG. 17 illustrates a power supply system including a DC power supply providing power to a switching circuit, which then provides pulsed DC power to a plasma load.

Discussion will now be directed to current paths, voltages, and forward or reverse biases existing on the various components illustrated in FIG. 14 during different phases of operation of one embodiment of a power supply system. The DC power supply 1402 can be power or current-regulated. During non-arcing conditions, current passes along first rail 1450 from the DC power supply 1402 to the switching circuit 1404. The switch 1426 is closed (or on), and the diodes 1410 and 1414 are also on, and thus current also passes in a near-lossless loop 1411 (see FIG. 17) through the inductor 1412, the diode 1410, the closed switch 1426, and the diode 1414 (optional). A voltage, $V_{AB}$, is equal to a process voltage during this phase of operation. The process voltage is a voltage across the plasma load 1406 given a steady state plasma impedance. This occurs when the plasma is ignited and sustained and thus is conducting, but can vary to some extent depending on plasma stability and process conditions (e.g., when reactive gas flow enters the plasma processing chamber). A voltage, $V_{EB}$, as measured from electrical node E to electrical node B is equal to the process voltage minus the forward conduction voltage drop across diode 1410 (e.g., $V_{EB}=V_{AB}-V_{AE}$).

The constant current loop 1411 maintains the diodes 1410 and 1414 (optional) in an on state, thus providing the first rail 1450 instant access to the voltage multiplier 1424 should the plasma load impedance 1406 rise for any reason. Thus, the voltage multiplier 1424 is ready to absorb power from the DC power supply 1402 after every 0 V transition of the switching circuit 1404 as well as after any malfunction caused by an impedance spike in the plasma load 1406. For instance, where there is a leak in the plasma chamber that suddenly extinguishes the plasma, power from the DC power supply 1402 can be shunted into the voltage multiplier 1424.

Figure 18:
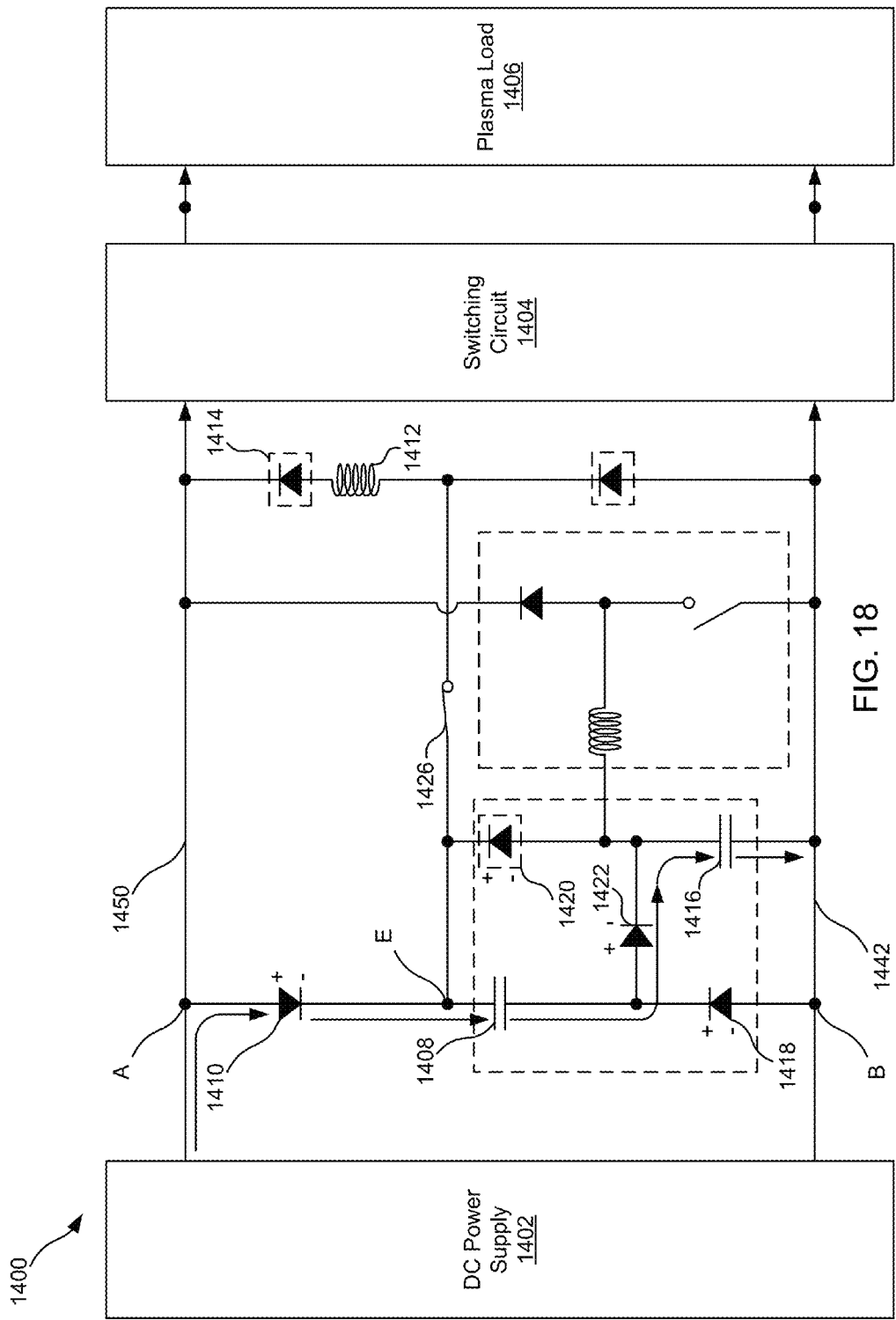
FIG. 18 illustrates the power supply system of FIG. 14 just after a 0 V transition of the switching circuit.

FIG. 18 illustrates the power supply system of FIG. 14 just after a 0 V transition of the switching circuit. After the 0 V transition, the plasma load 1406 impedance rises substantially such that the path of least resistance for most of the current is through diode 1410, first capacitor 1408, diode 1422, and capacitor 1416 to the second rail 1452. Diode 1418 is reverse biased, as is optional diode 1420 if implemented. The voltage between the rails, $V_{AB}$, when the current begins to take this route, is equal to the process voltage, $V_1$. The current charges the capacitors 1408 and 1416 and in doing so increases $V_{AB}$ above the process voltage, $V_1$. With the illustrated voltage multiplier 1424 (a voltage doubler), $V_{AB}$ can be boosted to substantially twice the processing voltage, $V_1$. In other embodiments, the voltage can be boosted to three, four, or any integer or fractional multiplier of the process voltage, $V_1$.

Figure 19:
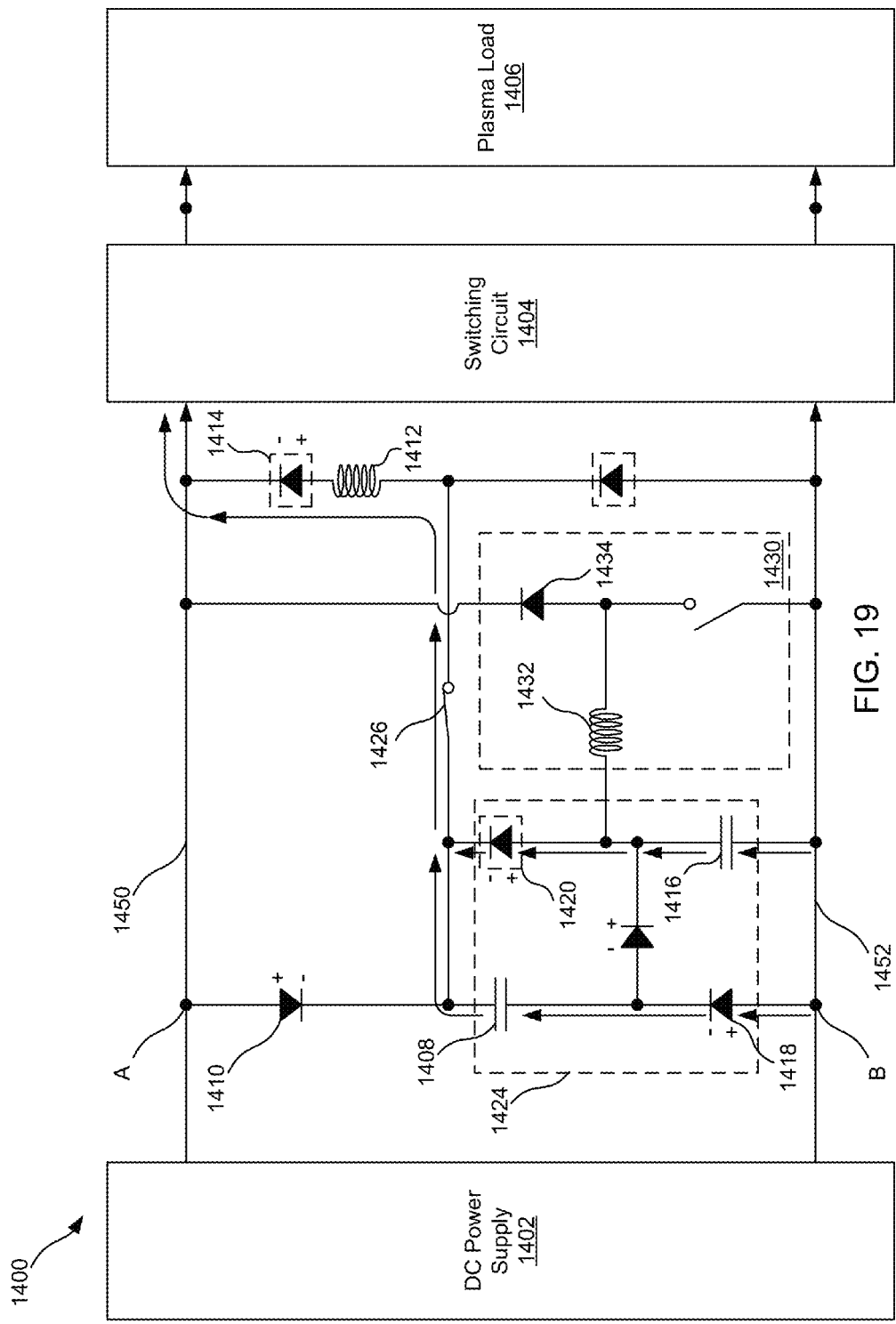
FIG. 19 illustrates the power supply system of FIG. 14 during a falling edge of a voltage boost from the snubber.

The current running along this path and the corresponding charging of the first and second capacitors 1408 and 1416 gradually falls off as the capacitors 1408 and 1416 are charged. Eventually the current flow tapers to a negligible amount or the current in the plasma ramps sufficiently to draw down the plasma load 1406 impedance to normal levels, such that power again is delivered to the plasma load 1406. When this happens, the voltage across the voltage multiplier, $V_{EB}$, is typically large enough to forward bias diode 1418 as well as optional diode 1420 if implemented, and diode 1422 turns off. The resulting current flow and diode biasing is illustrated in FIG. 19. Here, the capacitors 1408 and 1416 discharge in parallel through the closed switch 1426, the inductor 1412, and the optional diode 1414 until the capacitors 1408 and 1416 return to a voltage at which diodes 1418 and 1420 turn off (e.g., near process voltage).

In embodiments, where the voltage multiplier modifier 1430 is used to remove some portion of charge on the second capacitor 1416, optional diode 1420 is not needed, and in such embodiments the optional diode 1420 is reverse biased even if implemented. Either way, the second capacitor 1416 discharges via the inductor 1432 and diode 1434 rather than via the illustrated current path through optional diode 1420.

Figure 25A:
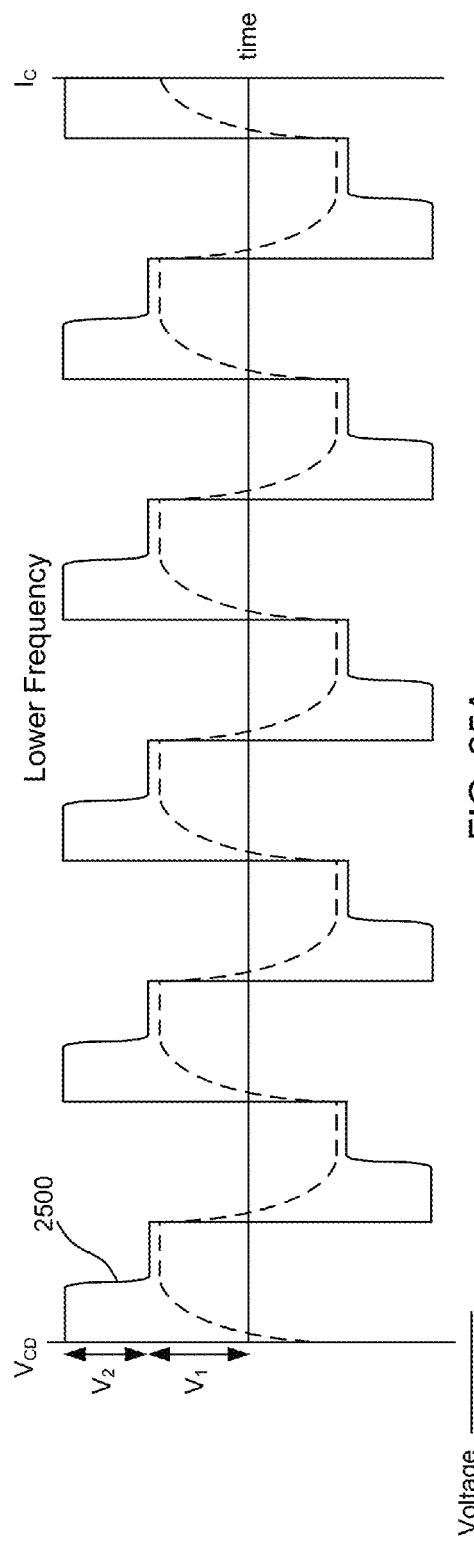
FIGS. 25A and 25B illustrate plots of voltage and current for a power supply system according to one embodiment of this disclosure.
Figure 25B:
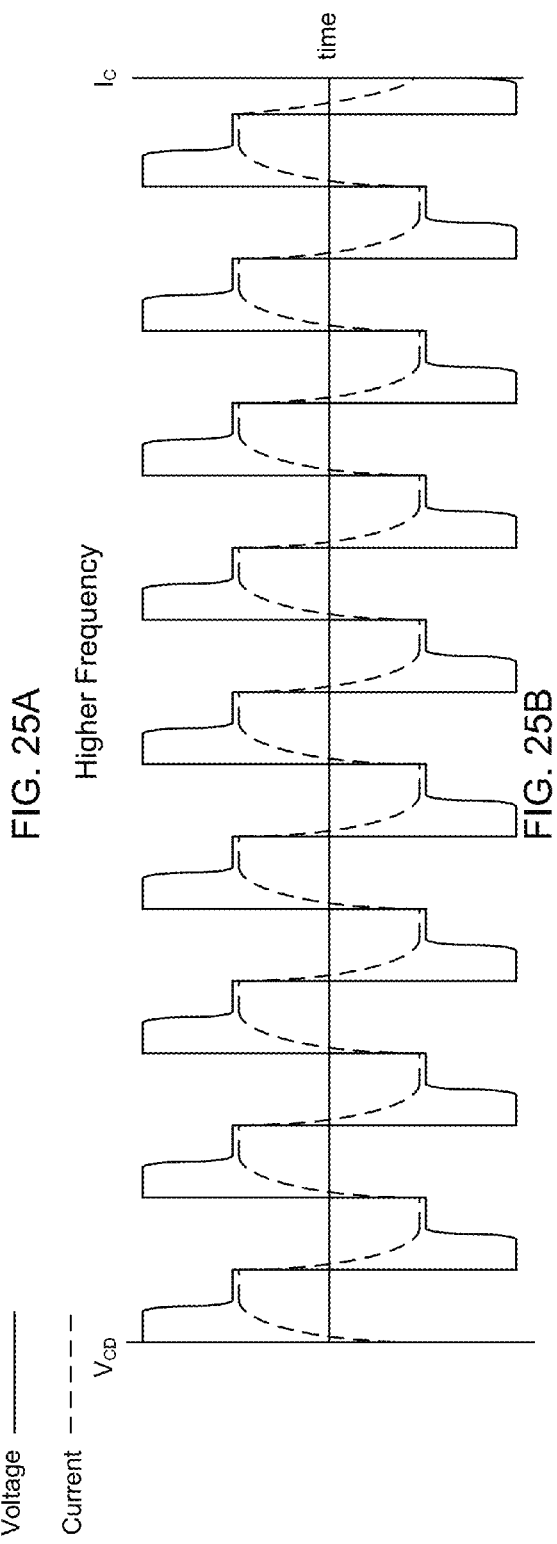

As the capacitors 1408 and 1416 discharge, the voltage $V_{AB}$ drops from $V_1+V_2$ to $V_1$ or the process voltage as seen in FIGS. 8A and 8B. However, this current flow can also cause the voltage fall time to be finite as illustrated in FIGS. 25A and 25B. FIGS. 25A and 25B illustrate the plots in FIGS. 8A and 8B, but include detail of the sloped voltage decrease 2500 attributable to the discharge of the capacitors 1408 and 1416 after the plasma impedance falls to normal levels.

As seen, diode 1410 is still forward biased, thus continuing to provide an instant shunt for power from the DC power supply 1402 to the voltage multiplier 1424 should it be needed. Even small amounts of power from the DC power supply 1402 can be directed into the voltage multiplier 1424, where the energy builds until the diodes 1418 and 1420 turn on and begin to discharge the capacitors 1408 and 1416. In this way, the capacitors 1408 and 1416 remain at voltages near or slightly above process voltage.

Figure 20:
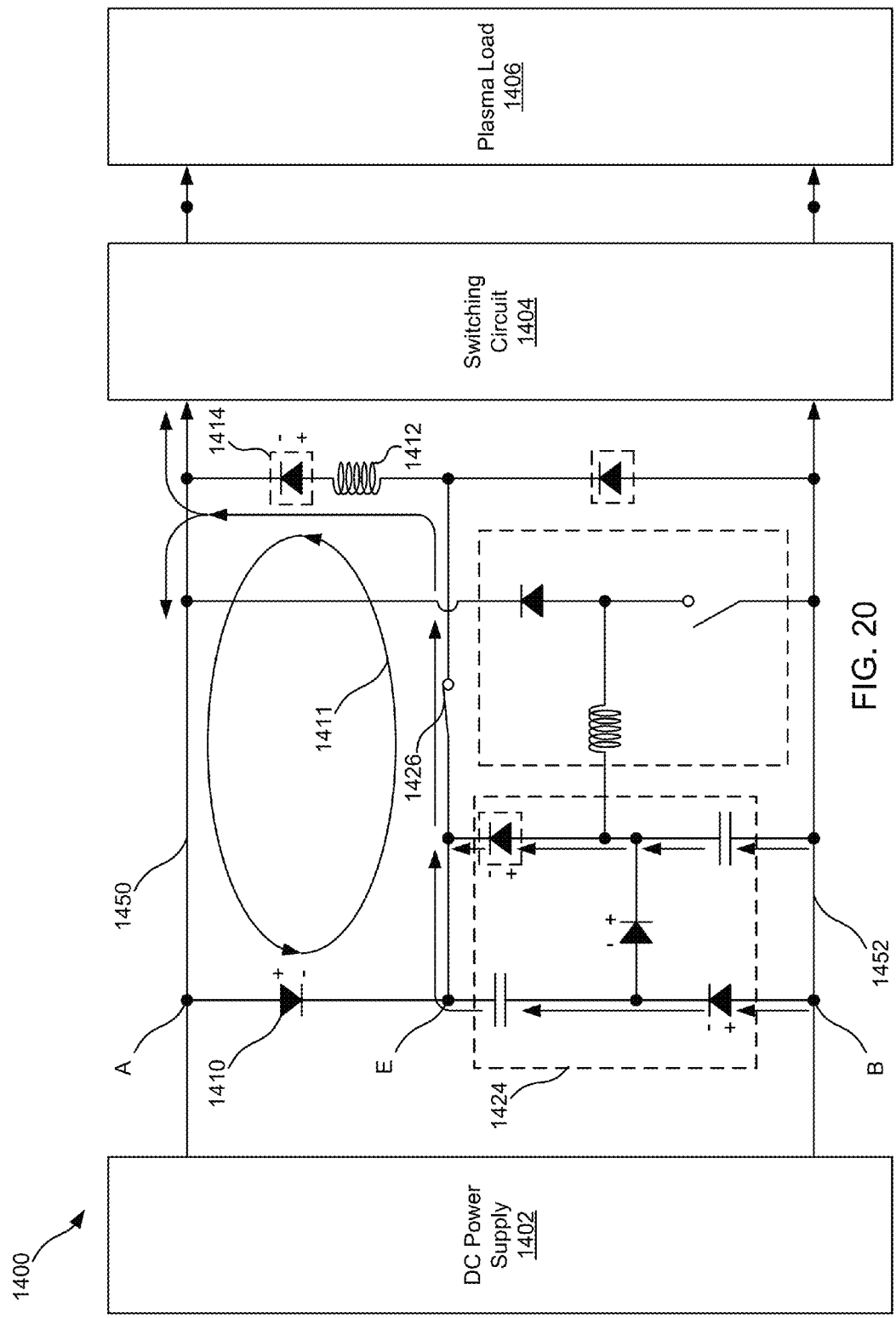
FIG. 20 illustrates the current paths and diode biases in the power supply system of FIG. 14 during a single arc event.

FIG. 20 illustrates the current paths and diode biases in the power supply system of FIG. 14 during a single arc event. During an arc, the plasma load impedance 1406 drops causing the voltage $V_{AB}$ to drop. When this happens, the voltage $V_{AB}$ typically falls below the voltage $V_{EB}$, which reverse biases the diode 1410 (illustrated as forward biased). While the voltage multiplier 1424 does discharge energy into the arc, the discharge is not large since the inductor 1412 limits the rise in current. In some cases, the inductor 1412 can be selected to be so large, that even during such an arc, the current does not appreciably rise. Thus, the voltage multiplier 1424 does not threaten to exacerbate arcs.

Figure 21:
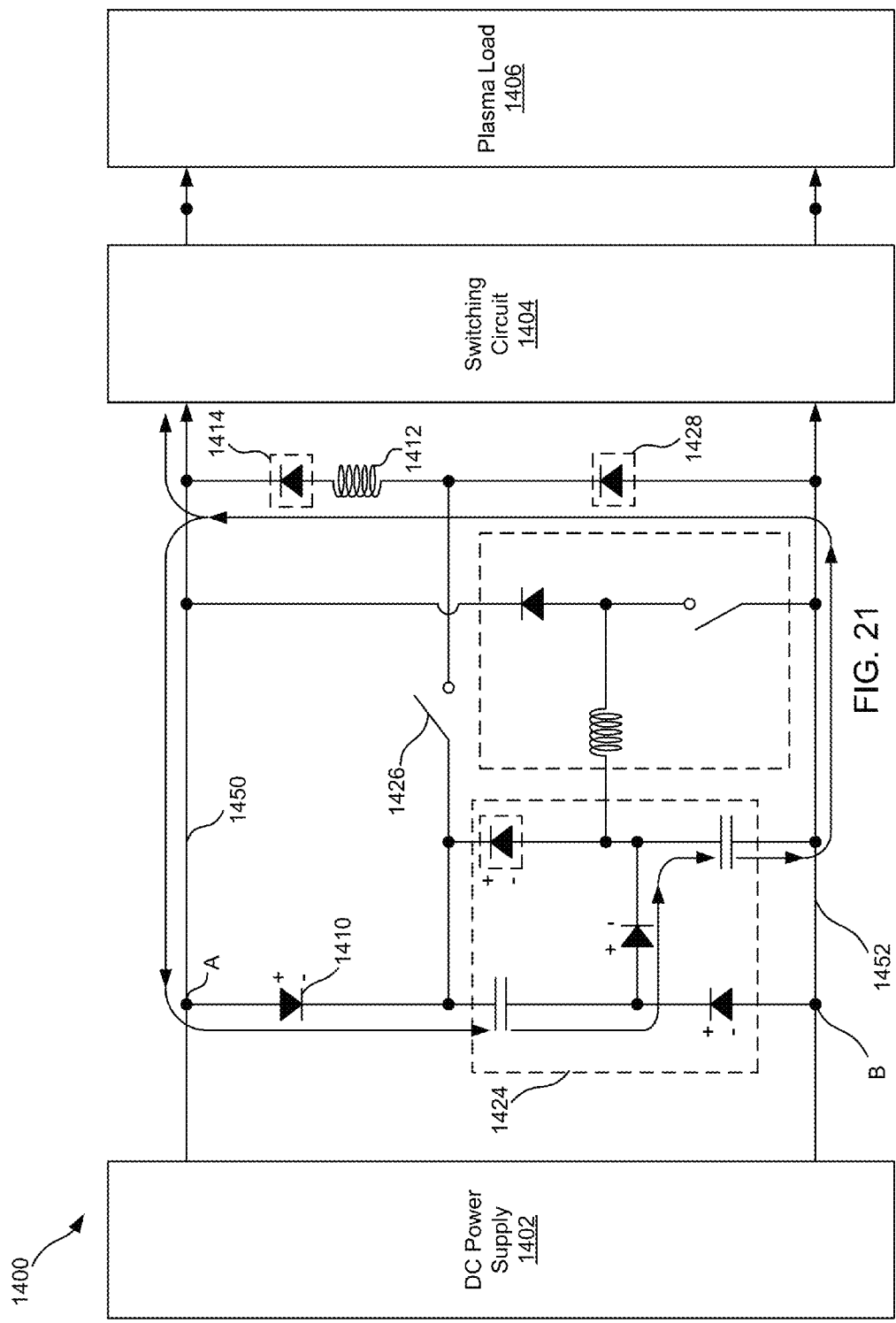
FIG. 21 illustrates the current paths and diode biases in the power supply system of FIG. 14 during a succession of high-frequency arcs.

The current leaves the snubber and heads to the switching circuit 1404 as well as back into the near-lossless loop 1411. If two arcs occur back-to-back, then the current in the inductor 1412 may step upwards due to multiple discharges from the capacitors in the voltage multiplier 1424. A series of arcs in rapid succession can stepwise increase the current to levels that could damage the diodes 1410 and 1414. Thus, when the current in the inductor 1412 reaches a threshold, the switch 1426 opens as seen in FIG. 21. The opening of the switch 1426 cuts the near-lossless loop 1411 and forces the inductor 1412 current to discharge into the voltage multiplier 1424. The inductor 1412 current ramps down and thus opening of the switch 1426 avoids runaway stepwise current ramping in the near-lossless loop 1411.

The current is illustrated as leaving the optional diode 1414 and heading either back to the diode 1410 or to the switching circuit 1404. In some cases, both current paths will be used. However, where the switching circuit 1404 is open, current does not pass to the switching circuit 1404 and instead all current passes through diode 1410 to the voltage multiplier 1424. In cases where the switching circuit 1404 is closed and there is an arc, current will prefer the path into the switching circuit 1404 and the arc. However, after the arc has ceased, or at least diminished, current may be more equally split between the two paths.

Optional diode 1428 can be included between the inductor 1412 and the second rail 1452 to provide a current path to the inductor 1412 when the switch 1426 opens, thereby avoiding voltage spikes in the inductor 1412.

Figure 15:
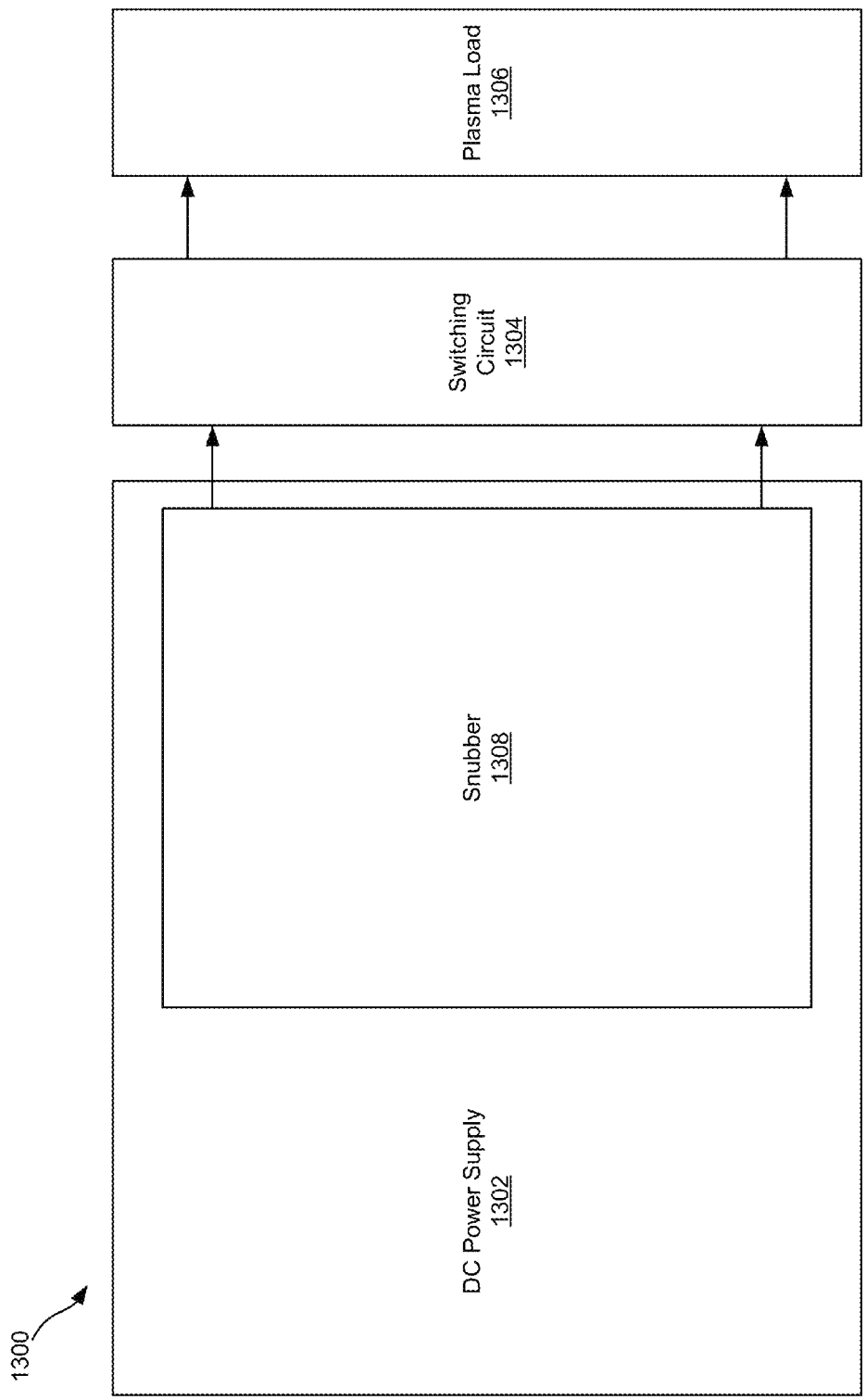
FIG. 15 illustrates a power supply system including a DC power supply providing power to a switching circuit, which then provides pulsed DC power to a plasma load.

FIG. 15 illustrates a power supply system including a DC power supply providing power to a switching circuit, which then provides pulsed DC power to a plasma load. A snubber 1508 can be incorporated into the DC power supply 1502, and power can be provided from the snubber 1508 to the switching circuit 1504.

Figure 16:
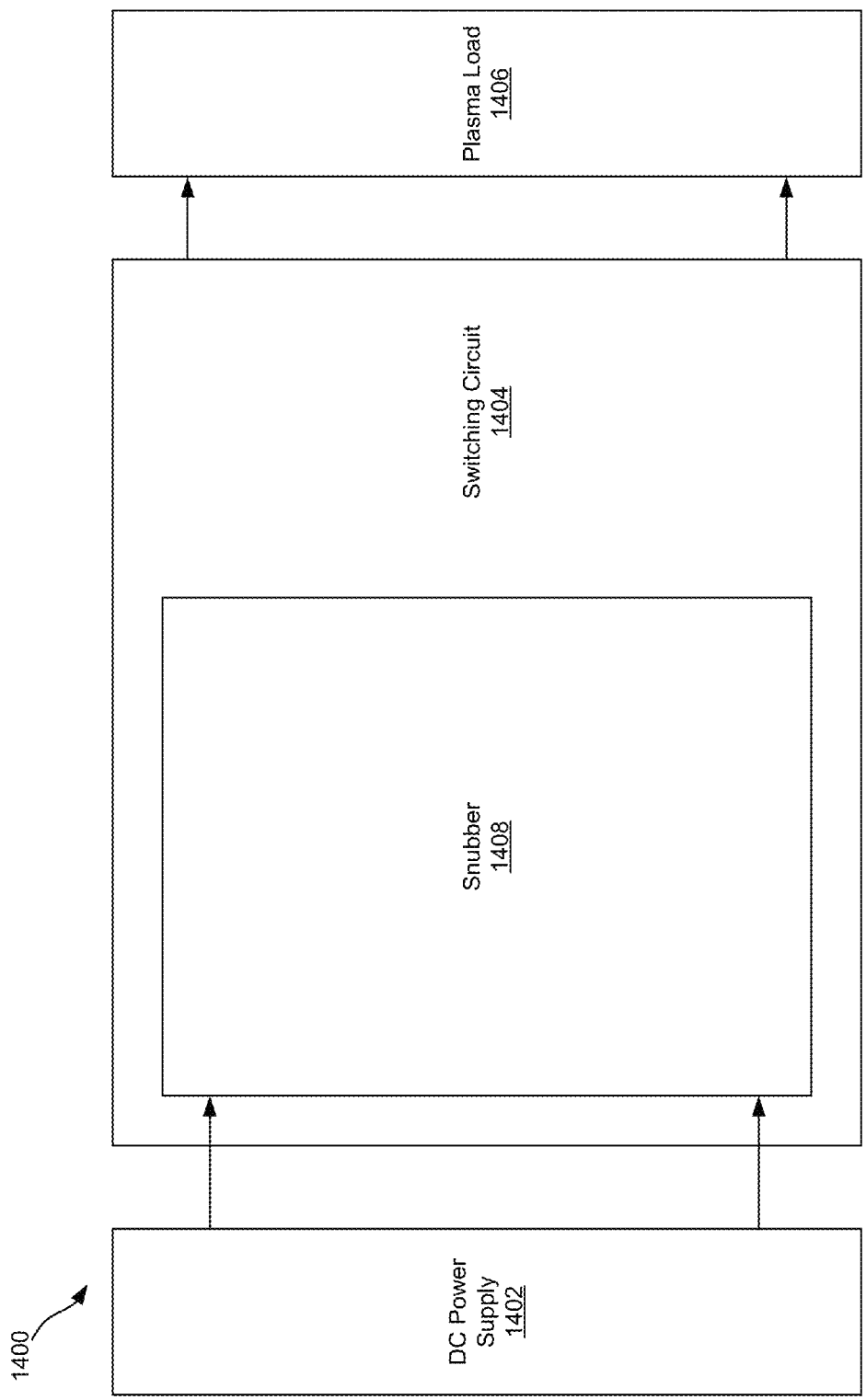
FIG. 16 illustrates a power supply system including a DC power supply providing power to a switching circuit, which then provides pulsed DC power to a plasma load.

FIG. 16 illustrates a power supply system including a DC power supply providing power to a switching circuit, which then provides pulsed DC power to a plasma load. A snubber 1608 can be incorporated into the switching circuit 1604, and power can be provided from the DC power supply 1602 to the snubber 1608.

Figure 26:
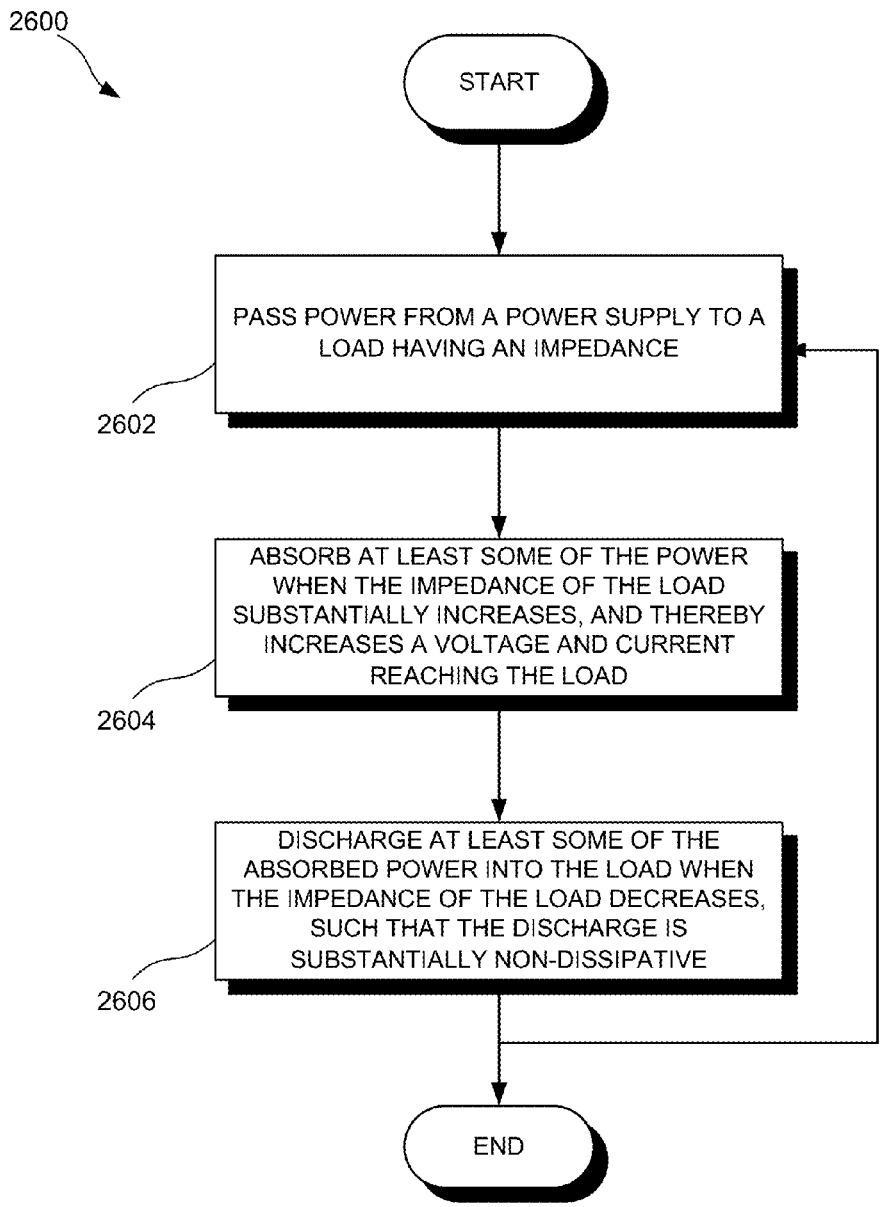
FIG. 26 illustrates a method of controlling power in a power supply system.

FIG. 26 illustrates a method of controlling power in a power supply system. The method 2600 can begin with the passage of power from a power supply (e.g., DC power supply) to a load via a pass power operation 2602. The load can have an impedance, and the impedance can change in time. When the impedance substantially increases, an absorbing at least some of the power operation 2604 can absorb at least some of the power from the power supply. Absorption of the power can cause a boost or increase to voltage and current reaching the load (e.g., 8A, 8B, 12, 25). After absorption of the power, the method 2600 can include a discharging at least some of the absorbed power operation 2606 where at least some of the absorbed power is discharged into the load. This discharge can be activated by a decrease in the load impedance and can take place in a substantially non-dissipative fashion. After the discharge operation 2606, the method 2600 can end or return to the passing power operation 2602.

Although this disclosure has focused on embodiments where snubbers are used to mitigate voltage and current spikes (or ramps) in a power supply system, and in particular for pulsed DC applications, it is envisioned that the disclosed snubber can be used in a variety of other voltage and/or current clamping situations.

Figure 22:
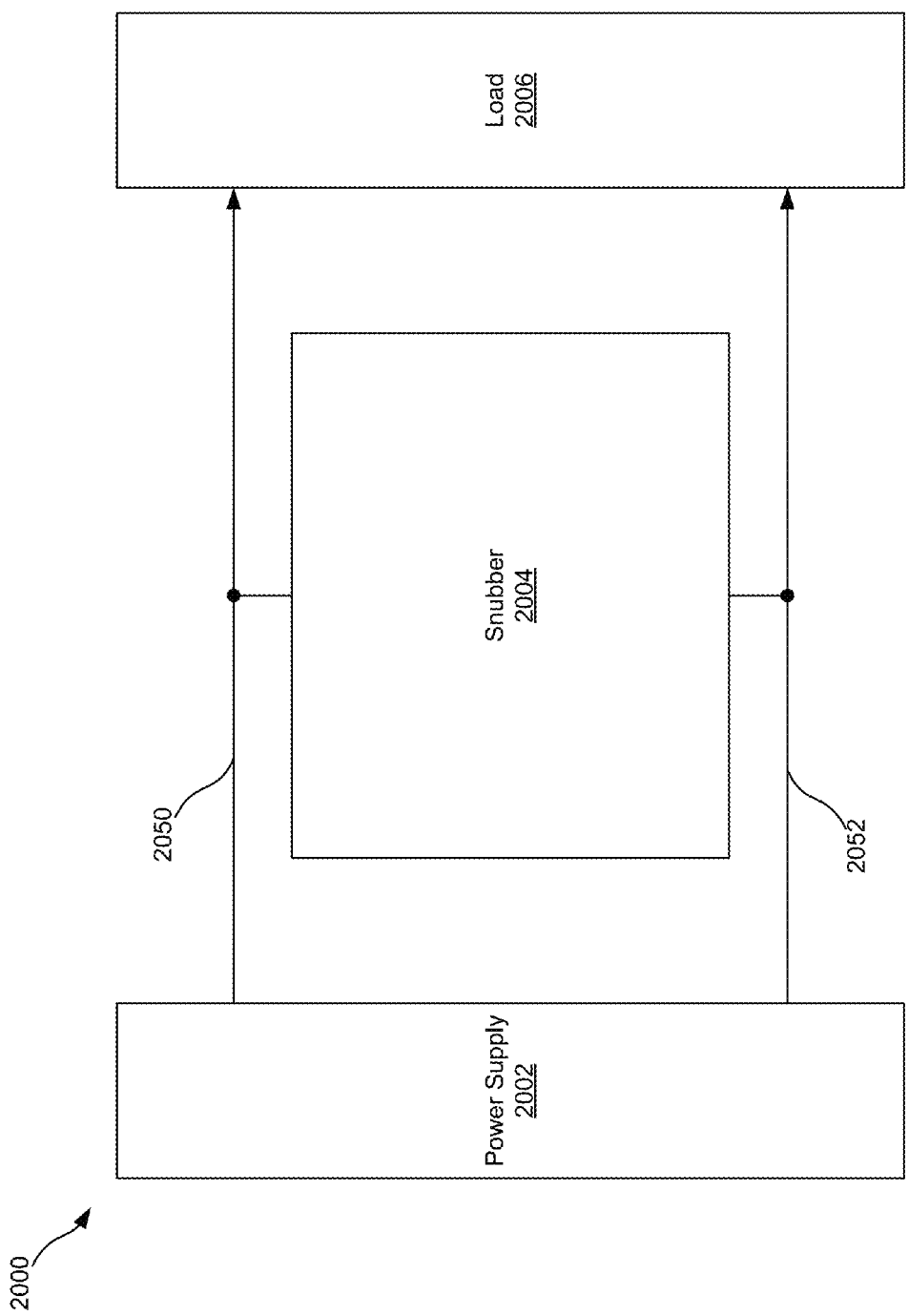
FIG. 22 illustrates another embodiment of a power supply system.

FIG. 22 illustrates another embodiment of a power supply system. A power supply (DC or AC) 2002 provides power to a load 2006 via first and second rails 2050 and 2052. The load 2006 can be a plasma load or any other type of load (e.g., a DC or AC electrical motor). A single magnetron sputtering system is one implementation of such a power supply system. A snubber 2004 can be coupled to the rails 2050 and 2052 between the power supply 2002 and the load 2006 and can be configured to absorb power from the power supply 2002 when an impedance of the load 2006 increases. As the load 2006 impedance decreases, the snubber 2004 can discharge some of its stored energy into the load 2006 to supplement power from the power supply 2002. Because little to no energy is dissipated in the snubber 2004, the snubber can be referred to as a non-dissipative snubber.

The snubber 2004 is further configured to temporarily boost a voltage as measured from the first rail 2150 to the second rail 2152, again in a non-dissipative manner. If the power supply 2002 is a power-regulated supply, then the voltage boost will result in faster current ramping when the power is first applied, or when power is reapplied in a pulsing context. This can decrease power turn on time, which can be useful in semiconductor fabrication applications, to name one example. For instance, where there is a problem with the load 2006 that drives the load 2006 impedance high (e.g., loss of plasma conductivity in a plasma processing chamber), power can be more quickly reapplied to the load 2006 after the problem has been resolved than with known snubbers.

Figure 23:
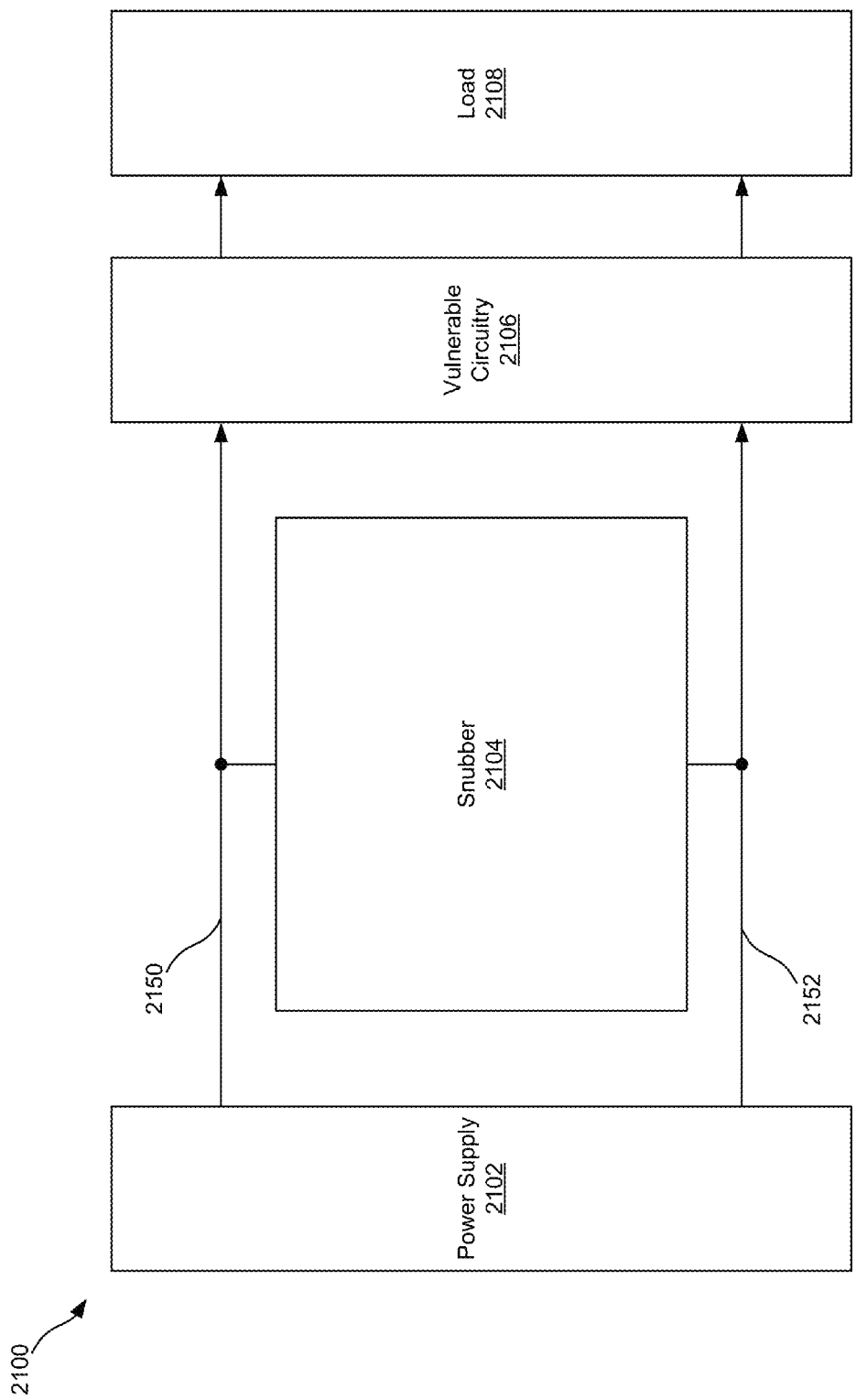
FIG. 23 illustrates yet another power supply system.

FIG. 23 illustrates yet another power supply system. A power supply (DC or AC) 2102 provides power to a load 2106 via first and second rails 2150 and 2152 and via vulnerable circuitry 2106. Vulnerable circuitry includes any circuitry that can be damaged by excessive currents or power and in particular can be damaged when an impedance of the load 2108 increases. A snubber 2104 can be coupled to the rails 2150 and 2152 between the power supply 2102 and the vulnerable circuitry 2106 and can be configured to absorb power from the power supply 2102 when an impedance of the load 2108 increases. In this way the snubber 2104 can prevent excessive power or currents from passing through the vulnerable circuitry 2106 and damaging components therein.

Returning to FIG. 24 illustrates yet a further power supply system. The power supply system 2400 can include a power supply 2402, a load 2406, a non-dissipative snubber 2460, and optionally vulnerable circuitry 2404. The snubber 2460 can be arranged between the power supply 2402 and the load 2406. The optional vulnerable circuitry 2404 can be arranged between the snubber 2460 and the load 2406.

The snubber 2460 functions much like the snubbers disclosed throughout this disclosure. However, the snubber 2460 does so using more generalized components, in order to show applications outside of the pulsed DC environment. For instance, rather than diodes, the snubber 2460 can include unidirectional switches 2410, 2414, and 2416. The snubber 2460 can also include an optional current limiter 2408 in series with the unidirectional switch 2410 as well as a current limiter 2412 in series with the unidirectional switch 2414. The snubber 2460 includes a switch 2422 and a voltage multiplier 2418. Optionally, the snubber 2460 can include a voltage multiplier modifier 2420. The snubber 2460 may further include an optional unidirectional switch 2404 arranged between the current limiter 2412 and the second rail 2452.

In some embodiments, the unidirectional switch 2410 can be arranged in series with the optional current limiter 2408, such as an inductor, so as to limit not only the direction of current into the voltage multiplier 2424, but to also limit the amount and rate of change of current entering the voltage multiplier 2424. Such an optional current limiter 2408 may be implemented to prevent current overload in the voltage multiplier 2424. In embodiments, where two or more of the herein disclosed snubbers 2460 are arranged in parallel, the optional current limiter 2408 may limit the current entering each of the snubbers so that voltage can remain at a reasonable level while still sending current to each of the two or more snubbers.

In such an embodiment, the optional current limiter 2408 in series with the first unidirectional switch 2410 can be selected so that current is able to rapidly enter and charge the voltage multiplier 2418, while the current limiter 2412 can be selected so that the voltage multiplier 2418 discharges at a lower current. This can lead to a rapid boosting of voltage to $V_1+V_2$ at the start of each DC pulse (see the first portion 802 of FIGS. 8A and 8B) while the voltage multiplier 2418 supplements the power supply 2402 current at $V_1$ over a longer second portion of each DC pulse.

In one embodiment, the first and second rails 2450 and 2452 are floating, such that neither is referenced to ground. The optional unidirectional switch 2414 can be excluded where an LC time constant is long. A "long" LC time constant is long enough to prevent the current limiter 2412 current from reversing direction. In particular, current in the current limiter 2412 would be sinusoidal without the optional unidirectional switch 2414, and so the LC time constant is preferably equal to a switching frequency of the vulnerable circuitry 2404, assuming the vulnerable circuitry 2404 includes a switching frequency. In a further preferred embodiment, the LC time constant is an order of magnitude greater than the switching frequency of the vulnerable circuitry 2404, assuming the vulnerable circuitry 2404 includes a switching frequency. The LC time constant can be calculated from the inductance of the current limiter 2412 and any capacitance of the voltage multiplier 2424. Two non-limiting examples of the vulnerable circuitry 2404 are an H-bridge (half or full bridge) and a double-pole double-throw switch network.

The load 2406 can be part of a plasma processing chamber, such as those used in plasma sputtering. Power can be provided to the load 2406 via one or more electrodes such as those in dual-magnetron sputtering (one or more magnetrons can also be used).

Figure 27:
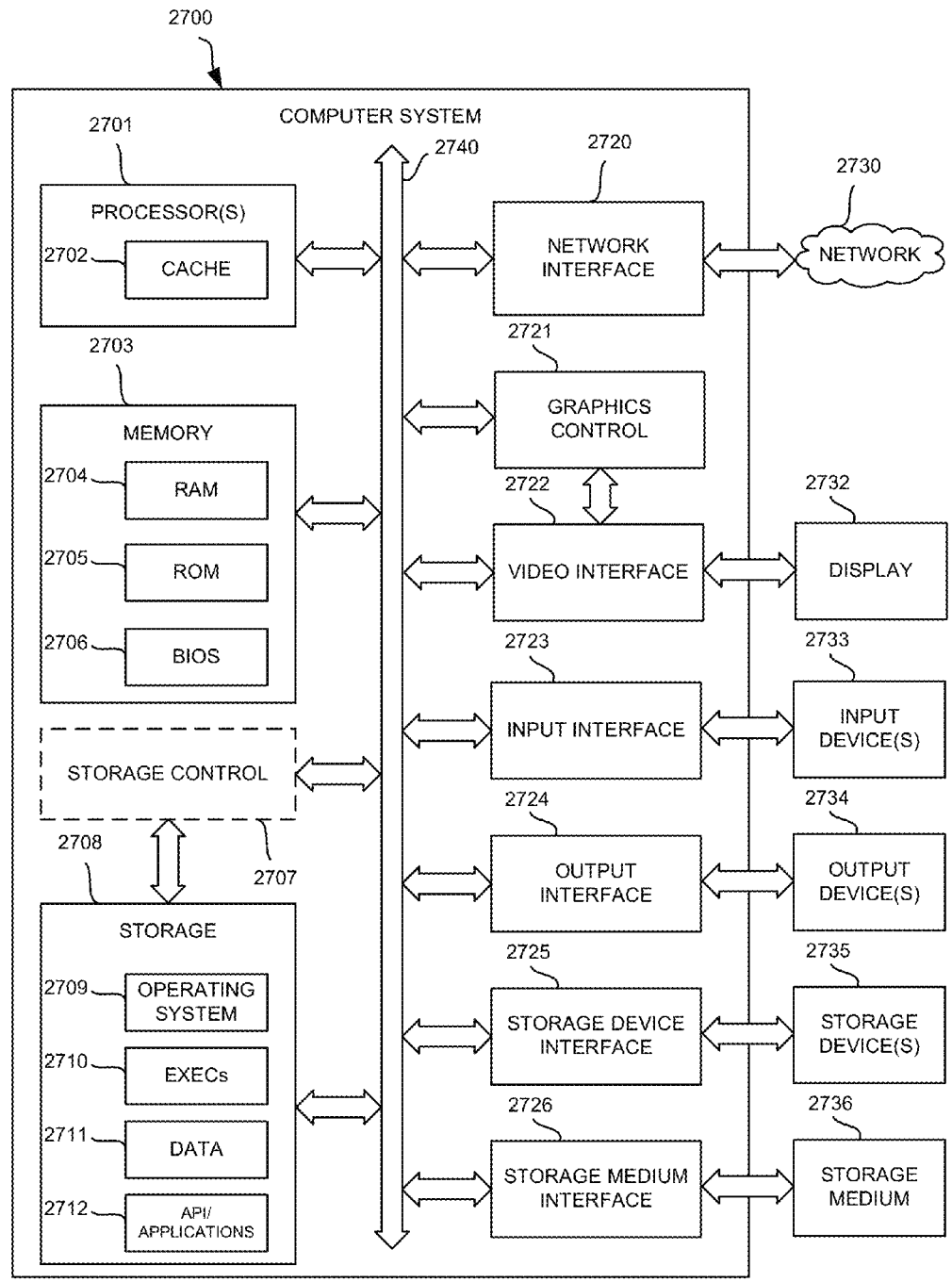
FIG. 27 shows a diagrammatic representation of one embodiment of a machine in the exemplary form of a computer system.

The systems and methods described herein can be implemented in a machine such as a computer system in addition to the specific physical devices described herein. FIG. 27 shows a diagrammatic representation of one embodiment of a machine in the exemplary form of a computer system 2700 within which a set of instructions can execute for causing a device to perform or execute any one or more of the aspects and/or methodologies of the present disclosure. The components in FIG. 27 are examples only and do not limit the scope of use or functionality of any hardware, software, embedded logic component, or a combination of two or more such components implementing particular embodiments.

Computer system 2700 may include a processor 2701, a memory 2703, and a storage 2708 that communicate with each other, and with other components, via a bus 2740. The bus 2740 may also link a display 2732, one or more input devices 2733 (which may, for example, include a keypad, a keyboard, a mouse, a stylus, etc.), one or more output devices 2734, one or more storage devices 2735, and various tangible storage media 2736. All of these elements may interface directly or via one or more interfaces or adaptors to the bus 2740. For instance, the various tangible storage media 2736 can interface with the bus 2740 via storage medium interface 2726. Computer system 2700 may have any suitable physical form, including but not limited to one or more integrated circuits (ICs), printed circuit boards (PCBs), mobile handheld devices (such as mobile telephones or PDAs), laptop or notebook computers, distributed computer systems, computing grids, or servers.

Processor(s) 2701 (or central processing unit(s) (CPU(s))) optionally contains a cache memory unit 2702 for temporary local storage of instructions, data, or computer addresses. Processor(s) 2701 are configured to assist in execution of computer readable instructions. Computer system 2700 may provide functionality as a result of the processor(s) 2701 executing software embodied in one or more tangible computer-readable storage media, such as memory 2703, storage 2708, storage devices 2735, and/or storage medium 2736. The computer-readable media may store software that implements particular embodiments, and processor(s) 2701 may execute the software. Memory 2703 may read the software from one or more other computer-readable media (such as mass storage device(s) 2735, 2736) or from one or more other sources through a suitable interface, such as network interface 2720. The software may cause processor(s) 2701 to carry out one or more processes or one or more steps of one or more processes described or illustrated herein. Carrying out such processes or steps may include defining data structures stored in memory 2703 and modifying the data structures as directed by the software.

The memory 2703 may include various components (e.g., machine readable media) including, but not limited to, a random access memory component (e.g., RAM 2704) (e.g., a static RAM "SRAM", a dynamic RAM "DRAM, etc.), a read-only component (e.g., ROM 2705), and any combinations thereof. ROM 2705 may act to communicate data and instructions unidirectionally to processor(s) 2701, and RAM 2704 may act to communicate data and instructions bidirectionally with processor(s) 2701. ROM 2705 and RAM 2704 may include any suitable tangible computer-readable media described below. In one example, a basic input/output system 2706 (BIOS), including basic routines that help to transfer information between elements within computer system 2700, such as during start-up, may be stored in the memory 2703.

Fixed storage 2708 is connected bidirectionally to processor(s) 2701, optionally through storage control unit 2707. Fixed storage 2708 provides additional data storage capacity and may also include any suitable tangible computer-readable media described herein. Storage 2708 may be used to store operating system 2709, EXECs 2710 (executables), data 2711, API applications 2712 (application programs), and the like. Often, although not always, storage 2708 is a secondary storage medium (such as a hard disk) that is slower than primary storage (e.g., memory 2703). Storage 2708 can also include an optical disk drive, a solid-state memory device (e.g., flash-based systems), or a combination of any of the above. Information in storage 2708 may, in appropriate cases, be incorporated as virtual memory in memory 2703.

In one example, storage device(s) 2735 may be removably interfaced with computer system 2700 (e.g., via an external port connector (not shown)) via a storage device interface 2725. Particularly, storage device(s) 2735 and an associated machine-readable medium may provide nonvolatile and/or volatile storage of machine-readable instructions, data structures, program modules, and/or other data for the computer system 2700. In one example, software may reside, completely or partially, within a machine-readable medium on storage device(s) 2735. In another example, software may reside, completely or partially, within processor(s) 2701.

Bus 2740 connects a wide variety of subsystems. Herein, reference to a bus may encompass one or more digital signal lines serving a common function, where appropriate. Bus 2740 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 2700 may also include an input device 2733. In one example, a user of computer system 2700 may enter commands and/or other information into computer system 2700 via input device(s) 2733. Examples of an input device(s) 2733 include, but are not limited to, an alpha-numeric input device (e.g., a keyboard), a pointing device (e.g., a mouse or touchpad), a touchpad, a joystick, a gamepad, an audio input device (e.g., a microphone, a voice response system, etc.), an optical scanner, a video or still image capture device (e.g., a camera), and any combinations thereof. Input device(s) 2733 may be interfaced to bus 2740 via any of a variety of input interfaces 2723 (e.g., input interface 2723) including, but not limited to, serial, parallel, game port, USB, FIREWIRE, THUNDERBOLT, or any combination of the above.

In particular embodiments, when computer system 2700 is connected to network 2730, computer system 2700 may communicate with other devices, specifically mobile devices and enterprise systems, connected to network 2730. Communications to and from computer system 2700 may be sent through network interface 2720. For example, network interface 2720 may receive incoming communications (such as requests or responses from other devices) in the form of one or more packets (such as Internet Protocol (IP) packets) from network 2730, and computer system 2700 may store the incoming communications in memory 2703 for processing. Computer system 2700 may similarly store outgoing communications (such as requests or responses to other devices) in the form of one or more packets in memory 2703 and communicated to network 2730 from network interface 2720. Processor(s) 2701 may access these communication packets stored in memory 2703 for processing.

Examples of the network interface 2720 include, but are not limited to, a network interface card, a modem, and any combination thereof. Examples of a network 2730 or network segment 2730 include, but are not limited to, a wide area network (WAN) (e.g., the Internet, an enterprise network), a local area network (LAN) (e.g., a network associated with an office, a building, a campus or other relatively small geographic space), a telephone network, a direct connection between two computing devices, and any combinations thereof. A network, such as network 2730, may employ a wired and/or a wireless mode of communication. In general, any network topology may be used.

Information and data can be displayed through a display 2732. Examples of a display 2732 include, but are not limited to, a liquid crystal display (LCD), an organic liquid crystal display (OLED), a cathode ray tube (CRT), a plasma display, and any combinations thereof. The display 2732 can interface to the processor(s) 2701, memory 2703, and fixed storage 2708, as well as other devices, such as input device(s) 2733, via the bus 2740. The display 2732 is linked to the bus 2740 via a video interface 2722, and transport of data between the display 2732 and the bus 2740 can be controlled via the graphics control 2721.

In addition to a display 2732, computer system 2700 may include one or more other peripheral output devices 2734 including, but not limited to, an audio speaker, a printer, and any combinations thereof. Such peripheral output devices may be connected to the bus 2740 via an output interface 2724. Examples of an output interface 2724 include, but are not limited to, a serial port, a parallel connection, a USB port, a FIREWIRE port, a THUNDERBOLT port, and any combinations thereof.

In addition or as an alternative, computer system 2700 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

One of skill in the art will recognize that the plots of voltage and current (e.g., FIGS. 2A, 2B, 8A, 8B, 25A, and 25B are not necessarily drawn to scale, and that the shape and scale of different features of the waveforms can change depending on the circuits used to generate these waveforms. For instance, the pulse width of the voltage increase at the start of each pulse may vary depending on the power passing to the snubber and depending on capacitance values within the snubber (e.g., the capacitances of the first capacitor 1408 and the second capacitor 1416 in FIG. 14). As another example, vertical aspects of the voltage pulses illustrated in FIGS. 8A and 8B may have less than infinite slope in practice. For instance, the falling edge of the boosted voltage (the first portion of each pulse) can have a negative slope that is a function of inductance and capacitance. The front vertical aspect of each pulse can in practice include an exponentially increasing portion for $V_2$ where the boost voltage rises above $V_1$ as a function of charge accumulation on the capacitors 1408 and 1416 in FIG. 14. Furthermore, while the current waveforms show a flat or near flat portion during a latter portion of each pulse, in practice the slope of this portion of the current waveform can vary and be non-zero. These examples demonstrate that the plots of voltage and current in the figures are meant as illustrations and generalizations only, and that variations on these specific waveforms can be made without departing from the scope of this disclosure.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A snubber circuit comprising:
   first and second power rails that in combination provide an input and output of the snubber circuit;
   a voltage multiplier coupled between the first power rail and the second power rail, the voltage multiplier boosting a voltage between the first and second power rail;
   a first unidirectional switch coupled between the first power rail and the voltage multiplier and blocking current attempting to pass from the voltage multiplier to the first power rail through the first unidirectional switch; and
   a first current limiter coupled between the first power rail and the voltage multiplier, the first current limiter providing a low-resistance current path from the voltage multiplier to the first power rail.

2. The snubber circuit of claim 1, wherein the snubber circuit is coupled between a power supply and a load having an impedance.

3. The snubber circuit of claim 2, wherein the voltage multiplier absorbs and stores energy from the power supply when the impedance of the load substantially increases.

4. The snubber circuit of claim 3, wherein a switching circuit is coupled between the snubber and the load and receives DC power from the power supply and provides pulsed DC power to the load.

5. The snubber circuit of claim 3, wherein the boosting of the voltage between the first and second power rails increases a current ramp rate of power reaching the load.

6. The snubber circuit of claim 1, wherein the snubber is a non-dissipative snubber.

7. The snubber circuit of claim 1, wherein the snubber is part of a switching circuit that converts DC power to pulsed DC power.

8. The snubber circuit of claim 1, wherein the snubber is part of a DC power supply provides DC power to vulnerable circuitry.

9. The snubber circuit of claim 8, wherein the vulnerable circuitry is arranged between the snubber and a load.

10. The snubber circuit of claim 1, further comprising a voltage multiplier modifier that controls an amount of the boosting of the voltage between the first and second power rails.

11. The snubber circuit of claim 1, further comprising a second unidirectional switch coupled in series with the first current limiter and allowing current to pass from the voltage multiplier to the first power rail, but blocking current attempting to pass into the voltage multiplier through the first current limiter.

12. The snubber circuit of claim 11, further comprising a second current limiter coupled in series with the first unidirectional switch.

13. The snubber circuit of claim 1, further comprising a switch coupled between the voltage multiplier and the first current limiter.

14. The snubber circuit of claim 13, wherein the switch opens when a current in the first current limiter reaches a threshold.

15. A method of operating a snubber circuit, the method comprising:
   storing energy from a first power rail in a voltage multiplier, the voltage multiplier coupled between the first power rail and a second power rail;
   boosting a voltage between the first and second power rails as a consequence of the storing;
   discharging at least some of the energy stored in the voltage multiplier to the first power rail via a change in current limiting device, thereby reducing the voltage between the first and second power rails;
   enabling current to pass from the first power rail to the voltage multiplier via a first unidirectional switch coupled between the first power rail and the voltage multiplier;
   blocking current from passing from the voltage multiplier to the first power rail via the first unidirectional switch.

16. The method of claim 15, further comprising receiving power from a DC power supply at the snubber circuit, and controlling a voltage provided to a switching circuit coupled between the snubber and the plasma load, the switching circuit receiving DC power from the power supply and providing AC power to the plasma load.

17. The method of claim 16, further comprising increasing the energy stored in the voltage multiplier when an impedance of the plasma load increases.

18. The method of claim 17, further comprising increasing a current ramp rate of power reaching the plasma load as a consequence of increasing the energy stored in the voltage multiplier.

19. The method of claim 15, further comprising controlling the boosting via a voltage multiplier modifier of the snubber circuit.

20. The method of claim 15, further comprising enabling current to pass from the voltage multiplier to the first power rail via the first current limiter and a second unidirectional switch, and blocking current from passing from the first power rail to the voltage multiplier via the first current limiter and the second unidirectional switch.

21. The method of claim 20, further comprising opening a switch between the voltage multiplier and the first current limiter when a current through the first current limiter reaches or exceeds a threshold.

22. A snubber circuit comprising:
   a first power rail;
   a second power rail;
   an input of the snubber circuit comprising first ends of the first and second power rail;
   an output of the snubber circuit comprising second ends of the first and second power rail;
   a voltage multiplier coupled between the first power rail and the second power rail;
   a first unidirectional switch coupled between the first power rail and the voltage multiplier, and preventing current from passing from the voltage multiplier to the first power rail through the first unidirectional switch; and
   a first current limiter coupled between the voltage multiplier and the first power rail.

* * * * *